(12) United States Patent
Brown Elliott et al.

(10) Patent No.: US 7,701,476 B2
(45) Date of Patent: Apr. 20, 2010

(54) FOUR COLOR ARRANGEMENTS OF EMITTERS FOR SUBPIXEL RENDERING

(75) Inventors: Candice Hellen Brown Elliott, Santa Rosa, CA (US); Thomas Lloyd Credelle, Morgan Hill, CA (US); Edward Eastle Thompson, Menlo Park, CA (US); Michael Francis Higgins, Duncans Mills, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 765 days.

(21) Appl. No.: 11/469,458

(22) Filed: Aug. 31, 2006

(65) Prior Publication Data

US 2007/0052887 A1    Mar. 8, 2007

Related U.S. Application Data

(63) Continuation of application No. 10/243,094, filed on Sep. 13, 2002, now abandoned.

(51) Int. Cl.
*G09G 5/02* (2006.01)

(52) U.S. Cl. .................. 345/694; 345/204; 345/96; 345/87; 345/589

(58) Field of Classification Search ............. 345/694, 345/204, 589, 96, 87
See application file for complete search history.

(56) References Cited

U.S. PATENT DOCUMENTS

| | | | |
|---|---|---|---|
| 3,971,065 A | 7/1976 | Bayer |
| 4,353,062 A | 10/1982 | Lorteije et al. |
| 4,593,978 A | 6/1986 | Mourey et al. |
| 4,632,514 A | 12/1986 | Ogawa et al. |
| 4,642,619 A | 2/1987 | Togashi |
| 4,651,148 A | 3/1987 | Takeda et al. |
| 4,751,535 A | 6/1988 | Myers |
| 4,773,737 A | 9/1988 | Yokono et al. |
| 4,786,964 A | 11/1988 | Plummer et al. |
| 4,792,728 A | 12/1988 | Chang et al. |
| 4,800,375 A | 1/1989 | Silverstein et al. |
| 4,853,592 A | 8/1989 | Strathman |
| 4,874,986 A | 10/1989 | Menn et al. |
| 4,886,343 A | 12/1989 | Johnson |
| 4,908,609 A | 3/1990 | Stroomer |
| 4,920,409 A | 4/1990 | Yamagishi |
| 4,965,565 A | 10/1990 | Noguchi |
| 4,966,441 A | 10/1990 | Conner |

(Continued)

FOREIGN PATENT DOCUMENTS

DE    199 23 527    11/2000

(Continued)

OTHER PUBLICATIONS

Adobe Systems, Inc., website, 2002, http://www.adobe.com/products/acrobat/cooltype.html.

(Continued)

*Primary Examiner*—Amare Mengistu
*Assistant Examiner*—Premal Patel
(74) *Attorney, Agent, or Firm*—Innovation Counsel LLP

(57) ABSTRACT

Novel three-color and four-color subpixel arrangements and architectures for display and the like are herein disclosed. Novel techniques for subpixel rendering on the above subpixel arrangements are also herein disclosed.

24 Claims, 26 Drawing Sheets

U.S. PATENT DOCUMENTS

| | | | |
|---|---|---|---|
| 4,967,264 A | 10/1990 | Parulski et al. | |
| 5,006,840 A | 4/1991 | Hamada et al. | |
| 5,052,785 A | 10/1991 | Takimoto et al. | |
| 5,113,274 A | 5/1992 | Takahashi et al. | |
| 5,132,674 A | 7/1992 | Bottorf | |
| 5,144,288 A | 9/1992 | Hamada et al. | |
| 5,233,385 A | 8/1993 | Sampsell | |
| 5,311,205 A | 5/1994 | Hamada et al. | |
| 5,311,337 A | 5/1994 | McCartney, Jr. | |
| 5,315,418 A | 5/1994 | Sprague et al. | |
| 5,334,996 A | 8/1994 | Tanigaki et al. | |
| 5,341,153 A | 8/1994 | Benzschawel et al. | |
| 5,398,066 A | 3/1995 | Martinez-Uriegas et al. | |
| 5,436,747 A | 7/1995 | Suzuki | |
| 5,461,503 A | 10/1995 | Deffontaines et al. | |
| 5,485,293 A | 1/1996 | Robinder | |
| 5,535,028 A | 7/1996 | Bae et al. | |
| 5,541,653 A | 7/1996 | Peters et al. | |
| 5,561,460 A | 10/1996 | Katoh et al. | |
| 5,563,621 A | 10/1996 | Silsby | |
| 5,579,027 A | 11/1996 | Sakurai et al. | |
| 5,648,793 A | 7/1997 | Chen | |
| 5,754,226 A | 5/1998 | Yamada et al. | |
| 5,792,579 A | 8/1998 | Phillips | |
| 5,815,101 A | 9/1998 | Fonte | |
| 5,821,913 A | 10/1998 | Mamiya | |
| 5,917,556 A | 6/1999 | Katayama | |
| 5,949,496 A | 9/1999 | Kim | |
| 5,973,664 A | 10/1999 | Badger | |
| 5,991,438 A | 11/1999 | Shaked et al. | |
| 6,002,446 A | 12/1999 | Eglit | |
| 6,008,868 A | 12/1999 | Silverbrook | |
| 6,034,666 A | 3/2000 | Kanai et al. | |
| 6,038,031 A | 3/2000 | Murphy | |
| 6,049,626 A | 4/2000 | Kim | |
| 6,061,533 A | 5/2000 | Kajiwara | |
| 6,064,363 A | 5/2000 | Kwon | |
| 6,072,445 A | 6/2000 | Spitzer et al. | |
| 6,097,367 A | 8/2000 | Kuriwaki et al. | |
| 6,108,122 A | 8/2000 | Ulrich et al. | |
| 6,137,560 A | 10/2000 | Utsumi et al. | |
| 6,144,352 A | 11/2000 | Matsuda et al. | |
| 6,160,535 A | 12/2000 | Park | |
| 6,184,903 B1 | 2/2001 | Omori | |
| 6,188,385 B1 | 2/2001 | Hill et al. | |
| 6,198,507 B1 | 3/2001 | Ishigami | |
| 6,219,025 B1 | 4/2001 | Hill et al. | |
| 6,225,967 B1 | 5/2001 | Hebiguchi | |
| 6,225,973 B1 | 5/2001 | Hill et al. | |
| 6,236,390 B1 | 5/2001 | Hitchcock | |
| 6,239,783 B1 | 5/2001 | Hill et al. | |
| 6,243,055 B1 | 6/2001 | Fergason | |
| 6,243,070 B1 | 6/2001 | Hill et al. | |
| 6,271,891 B1 | 8/2001 | Ogawa et al. | |
| 6,278,434 B1 | 8/2001 | Hill et al. | |
| 6,299,329 B1 | 10/2001 | Mui et al. | |
| 6,326,981 B1 | 12/2001 | Mori et al. | |
| 6,327,008 B1 | 12/2001 | Fujiyoshi | |
| 6,332,030 B1 | 12/2001 | Manjunath | |
| 6,348,929 B1 | 2/2002 | Acharya | |
| 6,360,023 B1 | 3/2002 | Betrisey et al. | |
| 6,377,262 B1 | 4/2002 | Hitchcock et al. | |
| 6,385,466 B1 | 5/2002 | Hirai et al. | |
| 6,392,717 B1 | 5/2002 | Kunzman | |
| 6,393,145 B2 | 5/2002 | Betrisey et al. | |
| 6,396,505 B1 | 5/2002 | Lui et al. | |
| 6,441,867 B1 | 8/2002 | Daly | |
| 6,453,067 B1 | 9/2002 | Morgan et al. | |
| 6,466,618 B1 | 10/2002 | Messing et al. | |
| 6,469,766 B2 | 10/2002 | Waterman et al. | |
| 6,545,653 B1 | 4/2003 | Takahara | |
| 6,593,981 B1 | 7/2003 | Haim et al. | |
| 6,674,430 B1 | 1/2004 | Kaufman | |
| 6,681,053 B1 | 1/2004 | Zhu | |
| 6,750,875 B1 | 6/2004 | Keely, Jr. | |
| 6,801,220 B2 | 10/2004 | Greier et al. | |
| 6,804,407 B2 | 10/2004 | Weldy | |
| 6,833,890 B2 | 12/2004 | Hong et al. | |
| 6,850,294 B2 | 2/2005 | Roh et al. | |
| 6,856,704 B1 | 2/2005 | Gallagher et al. | |
| 6,888,604 B2 | 5/2005 | Rho et al. | |
| 6,897,876 B2 | 5/2005 | Murdoch et al. | |
| 6,903,754 B2 | 6/2005 | Brown Elliott | |
| 6,930,676 B2 | 8/2005 | De Haan et al. | |
| 6,989,876 B2 | 1/2006 | Song et al. | |
| 7,545,395 B2 * | 6/2009 | Kurumisawa | 345/690 |
| 2001/0017515 A1 | 8/2001 | Kusunoki et al. | |
| 2001/0040645 A1 | 11/2001 | Yamazaki | |
| 2002/0012071 A1 | 1/2002 | Sun | |
| 2002/0015110 A1 | 2/2002 | Brown Elliott | |
| 2002/0017645 A1 | 2/2002 | Yamazaki et al. | |
| 2002/0030780 A1 | 3/2002 | Nishida et al. | |
| 2002/0054263 A1 | 5/2002 | Kim et al. | |
| 2002/0122160 A1 | 9/2002 | Kunzman | |
| 2002/0140831 A1 | 10/2002 | Hayashi | |
| 2002/0190648 A1 | 12/2002 | Bechtel et al. | |
| 2002/0191130 A1 * | 12/2002 | Liang et al. | 349/108 |
| 2003/0011603 A1 | 1/2003 | Koyama | |
| 2003/0011613 A1 * | 1/2003 | Booth, Jr. | 345/589 |
| 2003/0025709 A1 * | 2/2003 | Kim et al. | 345/589 |
| 2003/0034992 A1 | 2/2003 | Brown Elliott et al. | |
| 2003/0043567 A1 | 3/2003 | Hoelen et al. | |
| 2003/0071826 A1 | 4/2003 | Goertzen | |
| 2003/0071943 A1 | 4/2003 | Choo et al. | |
| 2003/0077000 A1 | 4/2003 | Blinn | |
| 2003/0085906 A1 | 5/2003 | Elliott et al. | |
| 2003/0103058 A1 | 6/2003 | Elliott et al. | |
| 2003/0128179 A1 | 7/2003 | Credelle | |
| 2003/0128225 A1 | 7/2003 | Credelle et al. | |
| 2004/0021804 A1 | 2/2004 | Hong et al. | |
| 2004/0046725 A1 | 3/2004 | Lee | |
| 2004/0061710 A1 | 4/2004 | Messing et al. | |
| 2004/0080479 A1 | 4/2004 | Credelle | |
| 2004/0085495 A1 | 5/2004 | Roh et al. | |
| 2004/0095521 A1 | 5/2004 | Song et al. | |
| 2004/0114046 A1 | 6/2004 | Lee et al. | |
| 2004/0169807 A1 | 9/2004 | Rho et al. | |
| 2004/0174389 A1 | 9/2004 | Ben-David et al. | |
| 2004/0179160 A1 | 9/2004 | Rhee et al. | |
| 2004/0196297 A1 | 10/2004 | Elliott et al. | |
| 2004/0213449 A1 | 10/2004 | Safaee-Rad | |
| 2004/0239837 A1 | 12/2004 | Hong et al. | |
| 2004/0247070 A1 | 12/2004 | Ali | |
| 2004/0263528 A1 | 12/2004 | Murdoch et al. | |
| 2005/0007327 A1 | 1/2005 | Elion et al. | |
| 2005/0068477 A1 | 3/2005 | Shin et al. | |
| 2005/0083356 A1 | 4/2005 | Roh et al. | |
| 2005/0094871 A1 | 5/2005 | Berns et al. | |
| 2005/0225563 A1 | 10/2005 | Brown Elliott et al. | |
| 2005/0225574 A1 | 10/2005 | Brown Elliott et al. | |
| 2005/0225575 A1 | 10/2005 | Brown Elliott et al. | |

FOREIGN PATENT DOCUMENTS

| | | |
|---|---|---|
| DE | 199 23 527 A1 | 11/2000 |
| EP | 0 158 366 A2 | 10/1985 |
| EP | 0 203 005 A1 | 11/1986 |
| EP | 0 322 106 A2 | 6/1989 |
| EP | 0 0671 650 | 9/1995 |
| EP | 0 812 114 A1 | 12/1997 |
| EP | 0 878 969 | 11/1998 |
| EP | 0 899 604 A2 | 3/1999 |
| EP | 1 261 014 A2 | 11/2002 |
| GB | 2 133 912 A | 8/1984 |

| | | |
|---|---|---|
| GB | 2 146 478 A | 4/1985 |
| JP | 60-107022 | 6/1985 |
| JP | 62 127716 | 6/1987 |
| JP | 02-000826 A | 1/1990 |
| JP | 03-78390 | 4/1991 |
| JP | 03-036239 B | 5/1991 |
| JP | 06-102503 | 4/1994 |
| JP | 08-202317 | 8/1996 |
| JP | 11-014978 | 1/1999 |
| JP | 02-983027 B2 | 11/1999 |
| JP | 2004-004822 | 1/2004 |
| JP | 2004 078218 | 3/2004 |
| WO | WO 00/21067 | 4/2000 |
| WO | WO 00/42564 | 7/2000 |
| WO | WO 00/42762 | 7/2000 |
| WO | WO 00/45365 | 8/2000 |
| WO | WO 00/67196 | 11/2000 |
| WO | WO 00/70392 | 11/2000 |
| WO | WO 01/10112 A2 | 2/2001 |
| WO | WO 01/29817 A1 | 4/2001 |
| WO | WO 01/52546 A2 | 7/2001 |
| WO | WO 02/11112 A2 | 2/2002 |
| WO | WO 02/059685 A2 | 8/2002 |
| WO | WO 03/014819 A1 | 2/2003 |
| WO | WO 03/050605 A1 | 2/2003 |
| WO | WO 03/056383 A1 | 7/2003 |
| WO | WO 2004/017129 A1 | 2/2004 |
| WO | WO 2004/021323 A2 | 3/2004 |
| WO | WO 2004/027503 A1 | 4/2004 |
| WO | WO 2004/086128 A1 | 10/2004 |
| WO | WO 2005/050296 A1 | 6/2005 |

OTHER PUBLICATIONS

Betrisey, C., et al., "Displaced Filtering for Patterned Displays," 2000, *Society for Information Display (SID) 00 Digest*, pp. 296-299.

Carvajal, D., "Big Publishers Looking Into Digital Books," Apr. 3, 2000, *The New York Times*, Business/Financial Desk.

Elliott, C., "Active Matrix Display Layout Optimization for Subpixel Image Rendering," Sep. 2000, Proceedings of the 1$^{st}$ International Display Manufacturing Conference, pp. 185-189.

Elliott, C., "New Pixel Layout for PenTile Matrix," Jan. 2002, Proceedings of the International Display Manufacturing Conference, pp. 115-117.

Elliott, C., "Reducing Pixel Count without Reducing Image Quality," Dec. 1999, *Information Display*, vol. 15, pp. 22-25.

Gibson Research Corporation, website, "Sub-Pixel Font Rendering Technology, How It Works," 2002, http://www.grc.com/ctwhat.html.

Martin, R., et al., "Detectability of Reduced Blue Pixel Count in Projection Displays," May 1993, *Society for Information Display (SID) 93 Digest*, pp. 606-609.

Microsoft Corporation, website, 2002, http://www.microsoft.com/reader/ppc/product/cleartype.html.

Microsoft Press Release, Nov. 15, 1998, Microsoft Research Announces Screen Display Breakthrough at COMDEX/Fall '98, PR Newswire.

Murch, M., "Visual Perception Basics," 1987, *SID*, Seminar 2, Tektronix, Inc., Beaverton, Oregon.

Okumura, H., et al., "A New Flicker-Reduction Drive Method for High-Resolution LCTVs," May 1991, *Society for Information Display (SID) International Symposium Digest of Technical Papers*, pp. 551-554.

Wendell, Brian A., Stanford University, "Fundamentals of Vision: Behavior, Neuroscience and Computation," Jun. 12, 1994, *Society for Information Display (SID) Short Course S-2*, Fairmont Hotel, San Jose, California.

"ClearType magnified," *Wired Magazine*, Nov. 8, 1999, Microsoft Typography, article posted Nov. 8, 1999, and last updated Jan. 27, 1999, © 1999 Microsoft Corporation, 1 page.

Credelle, Thomas L. et al., "P-00: MTF of High-Resolution PenTile Matrix™ Displays," *Eurodisplay 02 Digest*, 2002, pp. 1-4.

Daly, Scott, "Analysis of Subtriad Addressing Algorithms by Visual System Models," *SID Symp. Digest*, Jun. 2001, pp. 1200-1203.

Elliott, Candice H. Brown et al., "Color Subpixel Rendering Projectors and Flat Panel Displays," New Initiatives in Motion Imaging, SMPTE Advanced Motion Imaging Conference, Feb. 27-Mar. 1, 2003, Seattle, Washington, pp. 1-4.

Elliott, Candice H. Brown et al., "Co-optimization of Color AMLCD Subpixel Architecture and Rendering Algorithms," *SID Symp. Digest*, May 2002, pp. 172-175.

Feigenblatt, R.I., "Full-color imaging on amplitude-quantized color mosaic displays," *SPIE*, vol. 1075, Digital Image Processing Applications, 1989, pp. 199-204.

Johnston, Stuart J., "An Easy Read: Microsoft's ClearType," *InformationWeek Online*, Redmond, WA, Nov. 23, 1998, 3 pages.

Johnston, Stuart J., "Clarifying ClearType," *InformationWeek Online*, Redmond, WA, Jan. 4, 1999, 4 pages.

"Just Outta Beta," *Wired Magazine*, Dec. 1999, Issue 7.12, 3 pages.

Klompenhouwer, Michiel A. et al., "Subpixel Image Scaling for Color Matrix Displays," *SID Symp. Digest*, May 2002, pp. 176-179.

Markoff, John, "Microsoft's Cleartype Sets Off Debate on Originality," *The New York Times*, Dec. 7, 1998, 5 pages.

"Microsoft ClearType," http://www.microsoft.com/opentype/cleartype, Sep. 26, 2002, 4 pages.

Platt, John C., "Optimal Filtering for Patterned Displays," Microsoft Research, *IEEE Signal Processing Letters*, 2000, 4 pages.

Platt, John, "Technical Overview of ClearType Filtering," Microsoft Research, http://research.microsoft.com/users/jplatt/cleartype/default.aspx, Sep. 17, 2002, 3 pages.

Poor, Alfred, "LCDs: The 800-pound Gorilla," *Information Display*, Sep. 2002, pp. 18-21.

"Ron Feigenblatt's remarks on Microsoft ClearType™," http://www.geocities.com/SiliconValley/Ridge/6664/ClearType.html, Dec. 5, 1998, Dec. 7, 1998, Dec. 12, 1999, Dec. 26, 1999, Dec. 30, 1999, and Jun. 19, 2000, 30 pages.

"Sub-Pixel Font Rendering Technology," © 2003 Gibson Research Corporation, Laguna Hills, CA, 2 pages.

Werner, Ken, "OLEDs, OLEDs, Everywhere . . . ," *Information Display*, Sep. 2002, pp. 12-15.

Lee, Baek-woon et al., "40.5L: Late-News Paper: TFT-LCD with RGBW Color System," *SID 03 Digest*, 2003, pp. 1212-1215.

European Search Report, EP6770785, 1-2205, Nov. 4, 2009, 9 pages.

\* cited by examiner

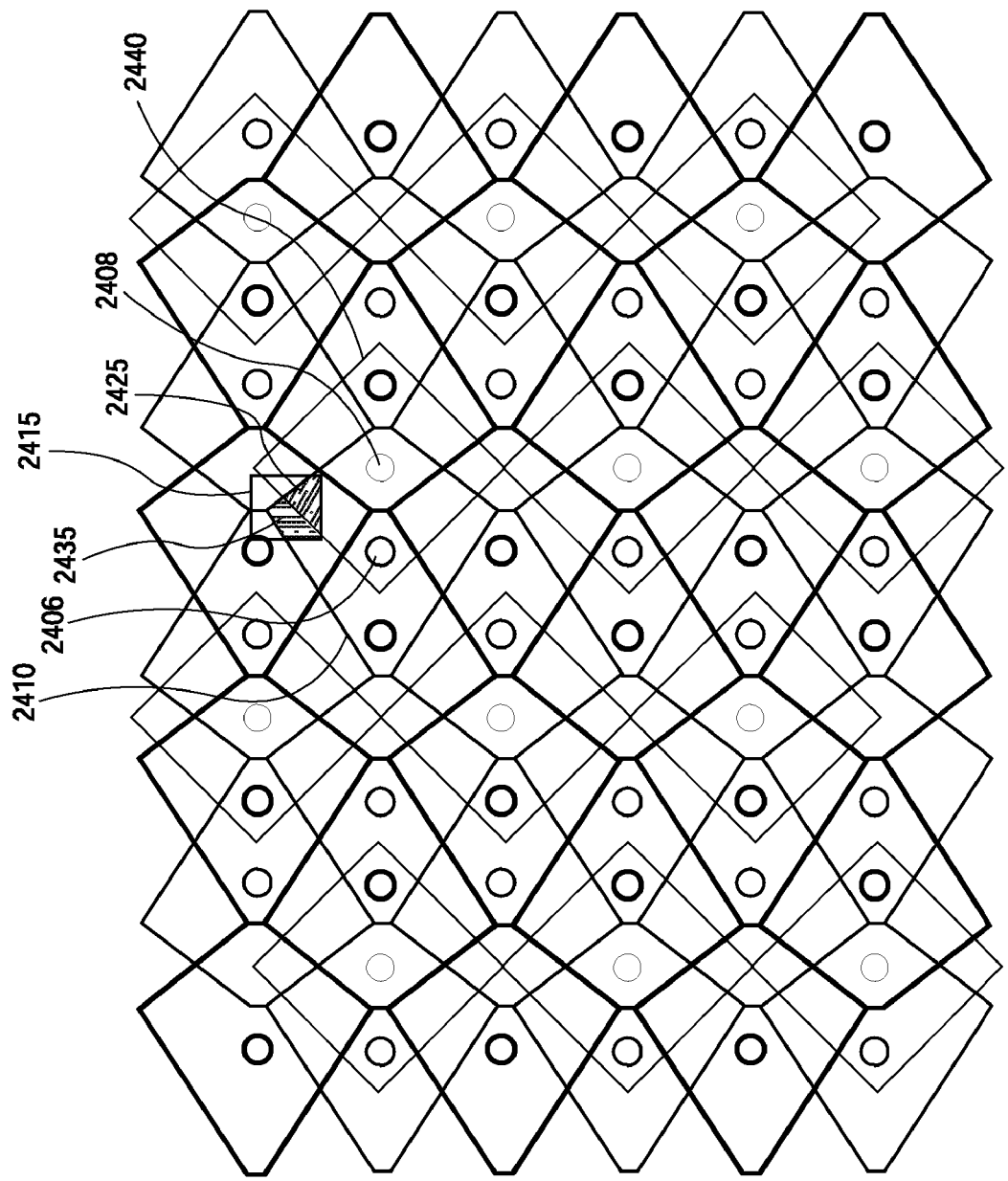

FOUR COLOR ARRANGEMENTS OF EMITTERS FOR SUBPIXEL RENDERING

This application is a continuation of co-pending U.S. application Ser. No. 10/243,094 filed on Sep. 13, 2002, and claims the benefit of priority thereof. U.S. application Ser. No. 10/243,094 is published as US Patent Application Publication 2004/0051724, which is hereby incorporated by reference herein.

RELATED APPLICATIONS

This application is related to U.S. patent application Ser. No. 10/051,612, published as US Patent Publication No. 2003/0034992 ("the '992 application), entitled "CONVERSION OF A SUB-PIXEL FORMAT DATA TO ANOTHER SUB-PIXEL DATA FORMAT," filed on Jan. 16, 2002, which is hereby expressly incorporated by reference herein. This application is also related to U.S. patent application Ser. No. 10/150,355, published as US Patent Publication No. 2003/0103058 ("the '058 application), entitled "METHODS AND SYSTEMS FOR SUB-PIXEL RENDERING WITH GAMMA ADJUSTMENT," filed on May 17, 2002, which is hereby expressly incorporated by reference herein.

BACKGROUND

Most conventional subpixelated displays utilize three emitter colors, providing a color gamut that includes the inside of a triangle when charted on the 1931 CIE Color Chart, an example of which is shown in FIG. 11. These colors are typically, substantially, red 1104, green 1106, and blue 1102. The luminance of these color emitters are typically unequal. For several reasons, some displays are constructed with a fourth color emitter. Prior art four color displays usually use white as the fourth color. This is typically done to increase the brightness of the display, as the colors are usually created using a color filter. The white is created by removing a color filter; and the light of the backlight which, being white already, is allowed to pass to the observer unobstructed. The four colors collectively are grouped into a pixel that may show any color within the triangle defined by the saturated colors, with the added ability to show lower saturation colors at a higher brightness by the addition of the appropriate amount of white.

For displays that are to be driven using a technique known in the art as Subpixel Rendering (SPR), an example of which is disclosed the '058 application, the choice of a non-filtered white subpixel creates a serious problem. Subpixel rendering depends on the ability to shift the apparent center of luminance by varying the brightness of the subpixels. This may work well when each of the colors has the same perceptual brightness. As was disclosed in co-pending and commonly assigned U.S. patent application Ser. No. 09/916,232, US Patent Publication No. 2003/0015110 ("the '110 application), entitled "Arrangement of Color Pixels for Full Color Imaging Devices with Simplified Addressing" to Elliott and herein incorporated by reference, the blue subpixels are perceived as substantially darker than the red and green, thus do not significantly contribute to the perception of increased resolution with subpixel rendering, leaving the task to the red and green subpixels. With the addition of an unfiltered white, the white subpixel, being significantly brighter than both the red and green subpixels, the red and green lose much of their effectiveness in subpixel rendering.

In FIG. 1, a prior art arrangement of four colors, sometimes called the Quad Arrangement, similar to the earlier Bayer pattern, but with one of the green subpixels replaced with a white, the repeat cell 112 consists of four subpixels, each of a different color, often red 104, green 106, blue 102, and white 108. The display is typically addressed using "whole pixel rendering" wherein the repeat cell is defined as the location of luminance information, without regard to the locations of the colored subpixels within. The colors typically have chromaticity coordinates such as those shown in FIG. 11; red 1104, green 1106, blue 1102, and white 1108. The white subpixel of this arrangement may typically be formed by removing the filter from the light path of a monochromatic LCD modulation pixel. This unfiltered white thus has significantly higher luminance than the other subpixels, which is typically the goal of the display designer.

When subpixel rendering is attempted on a four color system that has an unfiltered white, the subpixel rendering performance is substantially impaired due to the significantly higher luminance of the white subpixel. In an ideal display (of three or more color subpixel arrangement), the luminance of each of the subpixels would be equal, such that for low saturation image rendering, each subpixel has the same luminance weight. However, the human eye does not see each wavelength of light as equally bright. To the human eye, the ends of the spectrum are seen as darker than the middle. That is to say that a given energy intensity of a green wavelength is perceived to be brighter than that same energy intensity of either red or blue. Further, due to the fact that the short wavelength sensitive cones of the human eye, the "S-cones", those giving rise to the sensation of 'blue', do not feed the Human Vision System's luminance channel. As a result, blue colors appear even darker.

BRIEF DESCRIPTION OF THE DRAWINGS

The accompanying drawings, which are incorporated in and constitute a part of this specification, illustrate the invention and, together with the description, serve to explain the principles of the invention. In the figures.

FIGS. 24A and 24B show the reconstruction points and another novel set of resample areas for the arrangement of FIG. 22 in which one of the minority color plane resample areas is not shown for clarity.

DETAILED DESCRIPTION

Reference will now be made in detail to implementations and embodiments of the present invention as illustrated in the accompanying drawings. Wherever possible, the same reference numbers will be used throughout the drawings and the following description to refer to the same or like parts.

A. Subpixel Arrangements and Architectures

Now, there will be described a number of novel embodiments of three and four color subpixel arrangements.

Figure 29:
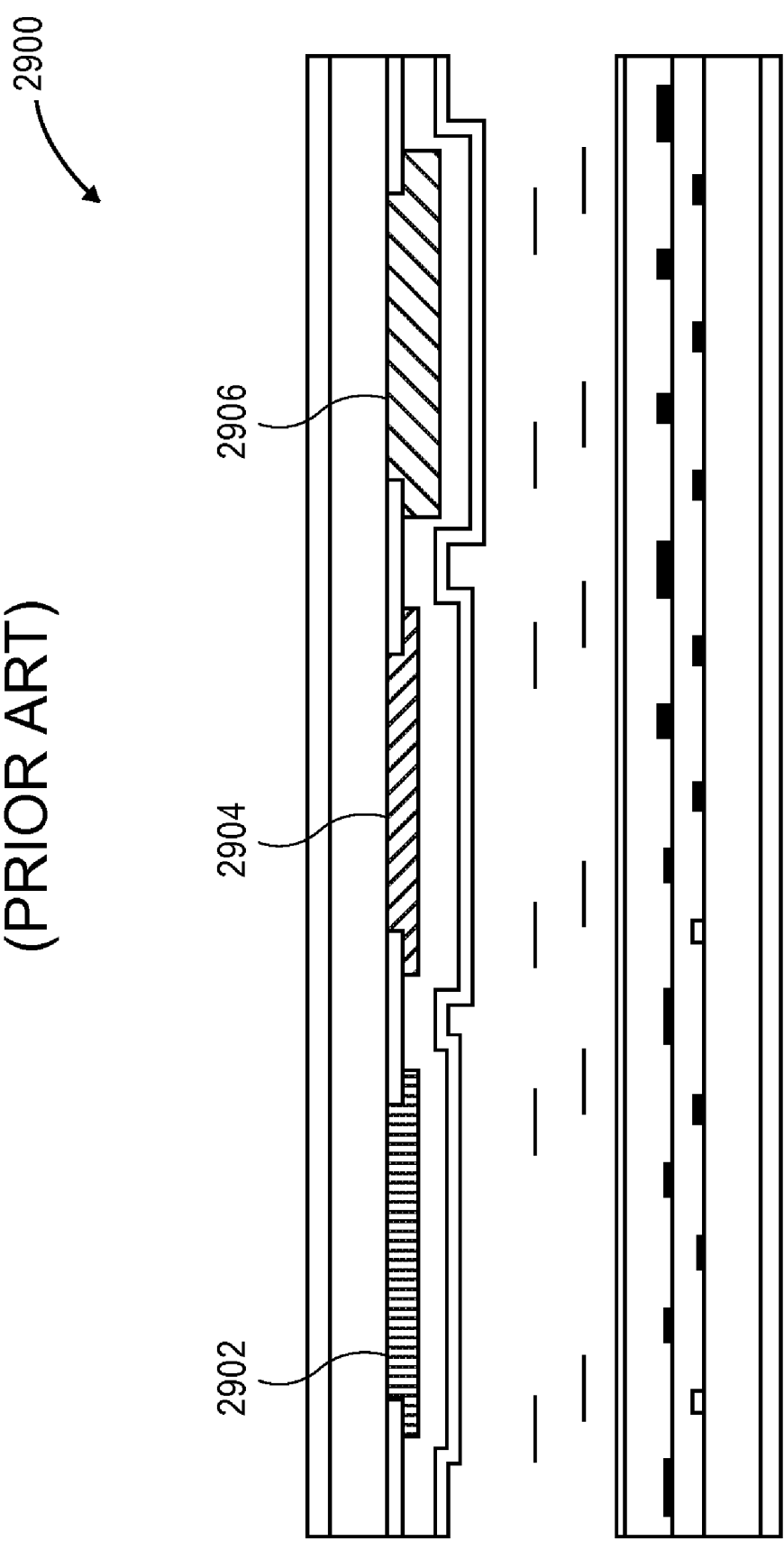
FIG. 29 is a side cut view of a conventional RGB stripe panel in which the red filter is physically thinner than the green filter.

To address a first concern mentioned above, the red and green subpixels may be adjusted to be of equal luminance by several techniques. One embodiment comprises keeping the same chromaticity points but increase the transmission of the lower luminance filter. There are several ways to accomplish this result: (1) make the red filter physically thinner than the green filter; (2) change the red pigment to either (a) reduce the amount of pigment in the filter; or (b) apply a different pigment comprising the same chromaticity but allows for greater transmissivity of light; or (3) apply a red filter that maintains substantially the same center of chromaticity but broadens the range of frequencies on either side of the center point. As one example, FIG. 29 is a side cut view of a conventional RGB stripe panel (2900) comprising a red filter (2902), a green filter (2904) and a blue filter (2906). FIG. 29 is further disclosed in U.S. Pat. No. 6,842,207 to Nishida et al. in which it is shown that the red filter is physically thinner than the green filter.

Another embodiment would keep the same chromaticity point but decrease the transmission of the higher luminance filter. As above, there are several ways to accomplish this result: (1) make the green filter physically thicker than the red filter; (2) change the green pigment to either (a) increase the amount of pigment; or (b) apply a different pigment comprising the same chromaticity but allows for a lesser transmissivity of light; or (3) apply a green filter that maintains substantially the same center of chromaticity but narrows the range of frequencies passed through on either side of the center point.

Another embodiment may be to increase the energy from the backlight of the transmissive panel (e.g. LCD) in the pass band of the lower luminance color filter relative to the higher luminance color filter pass band. For example, in a florescent backlight, the relative ratio of longer wavelength emitter phosphors to the shorter wavelength could be changed to favor the longer wavelength. In a multicolor LED backlight, the current or the pulse width modulated duty cycle of the longer wavelength LED (or groups of such LEDs) could be increased. These changes will cause a shift in the white point of the display, unless compensated for, as will be described further below.

Yet another embodiment narrows the pass band of the green subpixel such that the overall energy is reduced, while simultaneously shifting the chromaticity of the filter of the green subpixel. More specifically, it is possible to attenuate more of the longer wavelengths of the "green" band; while holding the red and the blue bands substantially unchanged. This may have two benefits. First, matching the luminance may allow for better subpixel rendering performance. Secondly, the reduced band pass increases the saturation and color gamut by pushing the green further from the white point. By being further from the white point, the white point of the display, with all of the subpixels turned on to maximum brightness, is allowed to remain at the desired point. The overall brightness of the display, for a given backlight will be reduced; but may be compensated for by increasing the backlight brightness.

Using a green subpixel that has been adjusted for lower luminance will shift the all-subpixels-on color point towards the magenta, unless compensated for in some manner. One such compensation technique includes a fourth color emitting subpixel that has substantial amounts of green light. For example, the arrangements in FIGS. 1, 3, 4, 5, 6, 7, 8, 9, and 10, may include a fourth color emitter subpixel that has significant green (medium wavelength light) emission such as cyan, greenish-blue, greenish-grey, and the like.

Figure 1:
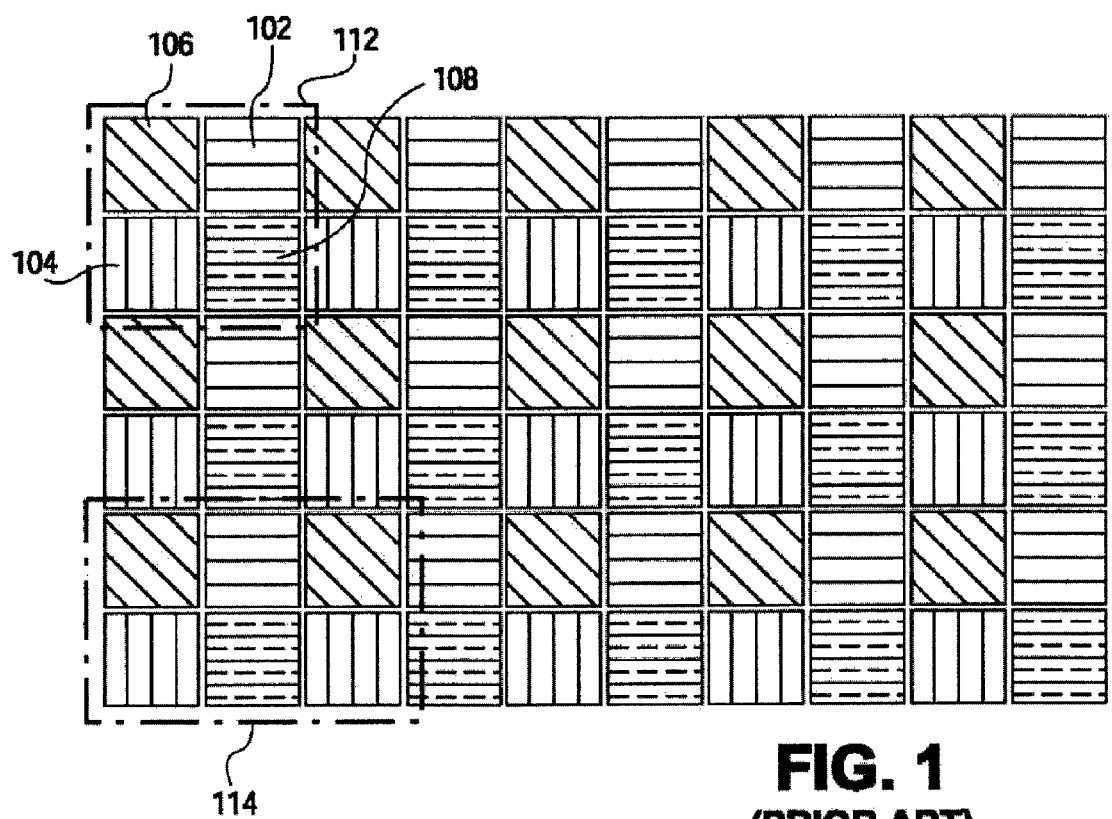
FIG. 1 shows a prior art four color arrangement for a display using a repeat cell consisting of four subpixels.

In FIG. 1, this may be one of the four subpixels in the repeat cell group 112, such as the lower right subpixel 108. In this example, the upper left subpixel 106 may be the luminance adjusted green. The color of the lower right subpixel 108 may also be chosen to be the same as that of the upper left subpixel 106, thus making this arrangement a luminance adjusted, improved Bayer Pattern of three colors.

Figure 27:
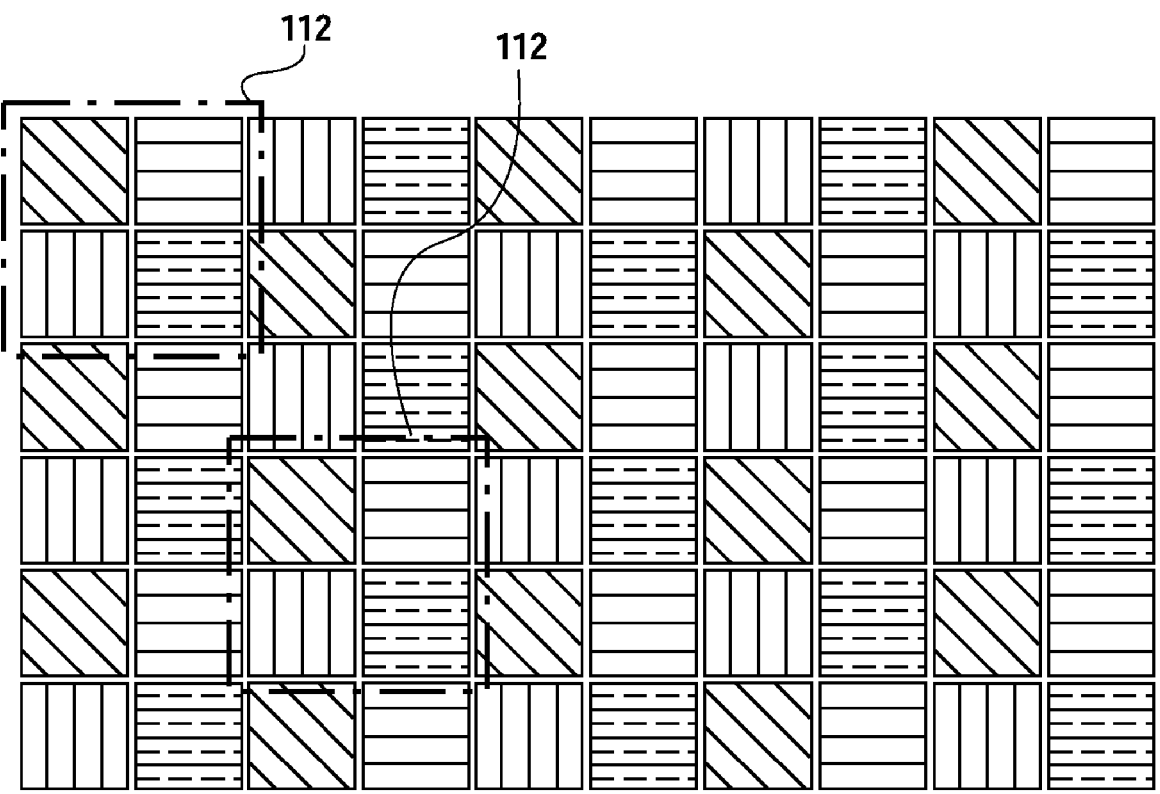
FIG. 27 shows a novel arrangement of four color elements.

FIG. 27 shows another embodiment based upon the Quad arrangement of FIG. 1, in which every other column of repeat cell 112 is shifted by one subpixel. Such an arrangement scatters the Fourier signal energy of any luminance mismatch between subpixels into additional directions.

Figure 20:
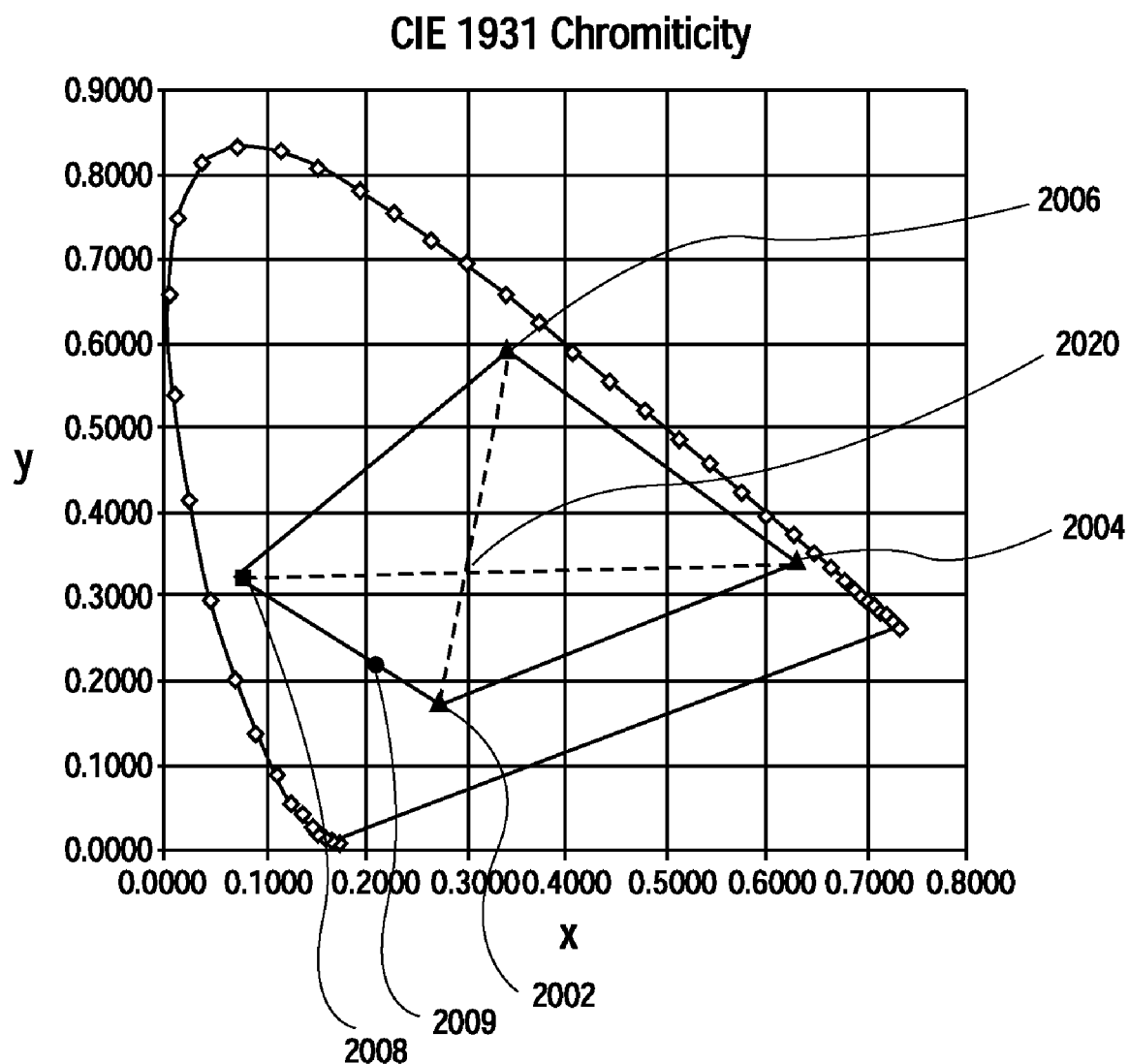
FIG. 20 is a chart showing the chromaticity coordinates of the emitters of a novel four color display.
Figure 21:
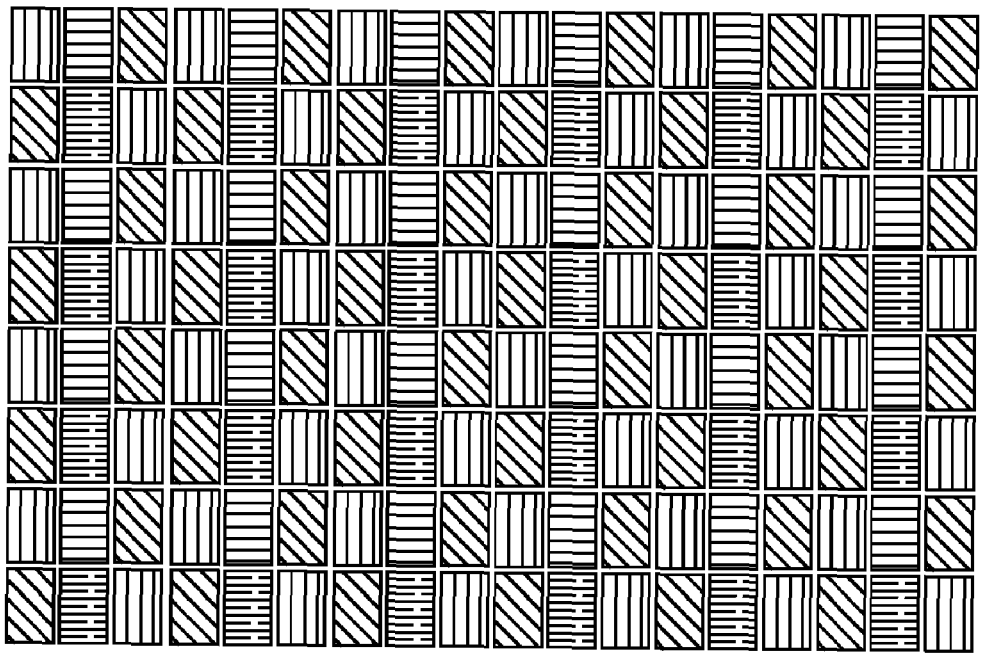
FIG. 21 shows a novel arrangement of four colors emitters for a display

Another embodiment using the Quad arrangement of FIG. 1 might be to chose the color points shown in FIG. 20, the four colors being red 2004, green, 2006, cyan 2008, and magenta 2002. It will be appreciated that there are a number of combinations for the choice of positions for each of the colors. All such combinations of which are to be considered to be in the scope of the present invention. One advantage of these arrangements of color points 2004, 2006, 2008, and 2002 is to improve subpixel rendering performance in which every color has substantial luminance such that each subpixel of a display using this arrangement is the center of a logical pixel.

Figure 2A:
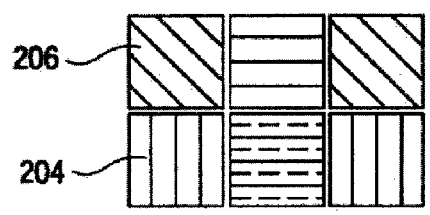
FIG. 2A shows a portion of FIG. 1, six subpixels as a group.
Figure 2B:
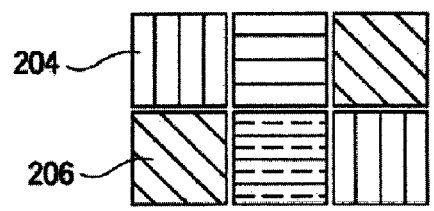
FIG. 2B shows another four-color six subpixel arrangement made in accordance with the principles of the present invention.

In yet another embodiment, the Quad arrangement 112 of FIG. 1 may be modified to improve subpixel rendering performance. To envision this improved arrangement, a larger group of subpixels 114 is removed from the context of the rest of the array, as in FIG. 2A. As shown, two green subpixels 206 are in the same upper row, while the two red 204 subpixels are in a same lower row. To enhance the subpixel rendering process, an improved layout may have one of each color (red and green) in every column and row, save for the column that includes the blue—to form a red and green checkerboard. Thus, the red 204 and green 206 subpixels are reversed in one of the columns, for example, the left, to form the arrangement of FIG. 2B. It will be appreciated that interchanging the right hand column would produce the same result. Taking the arrangement of FIG. 2B, and using it as the repeat cell 320 for a larger array, the arrangement of color subpixels is obtained as shown in FIG. 3.

Figure 3:
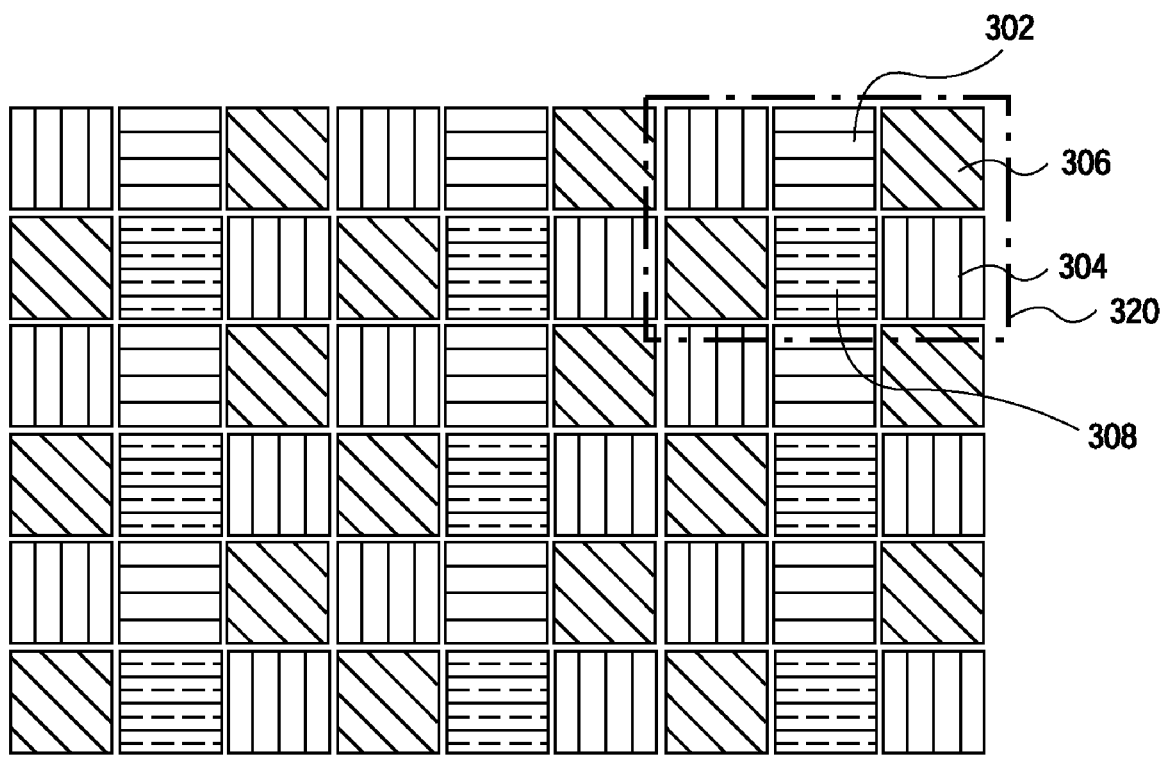
FIG. 3 shows a novel arrangement of four colors utilizing the arrangement of FIG. 2B as the repeat cell.

Examining FIG. 3, every row contains both red 304 and green 306 subpixels in an alternating manner. Two out of three columns contains both red 304 and green 306 subpixels, alternating. The alternation of the red 304 and green 306 subpixels in both columns and rows forms an approximate red and green subpixel checkerboard. One out of three columns contains two other colors that are in the numerical minority. These two other colors may be blue 302 and a suitable fourth color 308. In FIG. 3, the number of red subpixels 304 and the number of green subpixels 306, per repeat cell is two each, while there is only one blue and one fourth color. As previously mentioned, it may be a desired property of a subpixelated color display that, when all of the subpixels are turned on to their brightest point, the panel appears white. In addition, a desired property may have all of the subpixels of the same luminance. Given these properties, a number of color combinations are possible as described herein.

It will be appreciated, though, that suitable subpixel rendering could occur on a four-color arrangement whereby, when all subpixels in a group are fully "on", the color is off the white point. It may be desirable to compensate and adjust the relative energy of each of the subpixels to display a pleasing white. This could be accomplished by electronically, or by software (machine readable medium), reducing the output of the dominant color or colors by an appropriate scaling factor.

Figure 11:
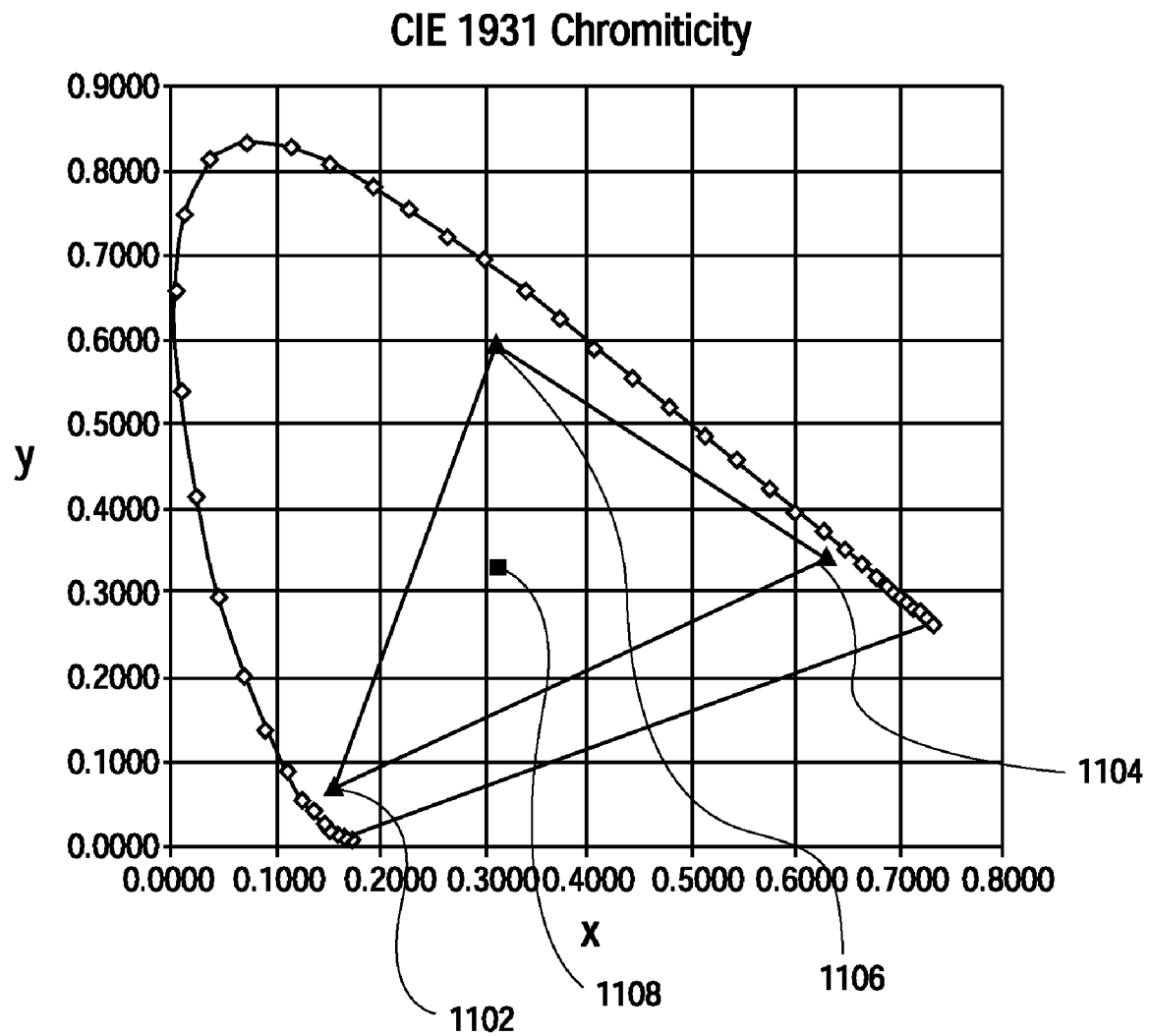
FIG. 11 is a chart showing the chromaticity coordinates of the emitters of a prior art four color display.

As for suitable color combinations, the same red 1104, blue 1102, and green 1106 can be used. In prior art panels, the fourth color was white 1108, as shown in FIG. 11. However, since there is only one blue subpixel 302 compared to two red subpixels 306 and two green subpixels 304 per repeat cell 320, the choice of white, adding equal parts red, green, and blue, may cause the panel to have a yellowish cast when all of the pixels are turned on. Further, in prior display systems, the white subpixel was usually formed by removing the filter over the subpixel, allowing all of the light through the subpixel, creating a very bright subpixel. This was possibly good for increasing the brightness of the display, but it interferes with the operation of subpixel rendering and may create a very "dotted" or "grainy" appearance. One improved embodiment of this arrangement is to use a neutral grey filter—keeping the same white color point, but reducing the luminance to be approximately that of the red 1104 and/or green 1106, or somewhere between them. Another improved embodiment would be to increase the amount of blue, as compared to red and green light, of the backlight, in which case the actual color point of the backlight would be more blue-ish than white. Thus, the yellowish cast may be improved by increasing the color temperature of the backlight.

Figure 12:
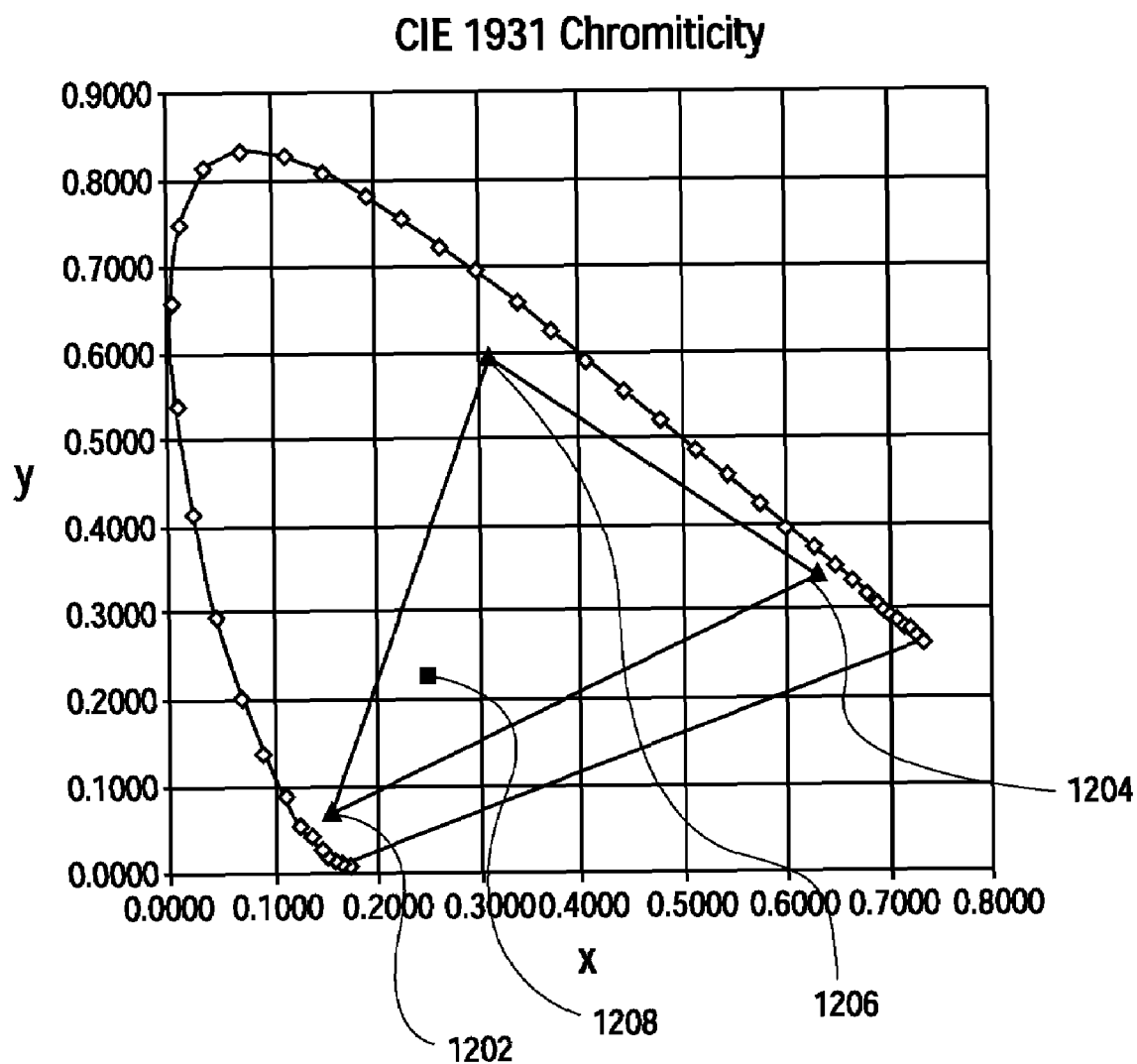
FIG. 12 is a chart showing the chromaticity coordinates of the emitter of a novel four color display.

Another suitable embodiment for choice of colors is shown in FIG. 12. Here, the traditional red 1204, green 1206, and blue 1202 are chosen, but the fourth color is selected to be "blue-grey" with the luminance set to be approximately that of the red 1102 and/or green 1104, or somewhere between them if they are not equal. The luminance may be so set either electronically or by the adjusting the filter and/or pigment as discussed above. This blue-grey filter allows more blue to pass through, or emit more blue, than red and green. This is akin to using a bluer backlight. As yet another embodiment, a combination of a higher color temperature backlight and blue-grey filter may be used. Such a resulting system might provide a more pleasing white point for the display when all subpixels are turned on.

Figure 13:
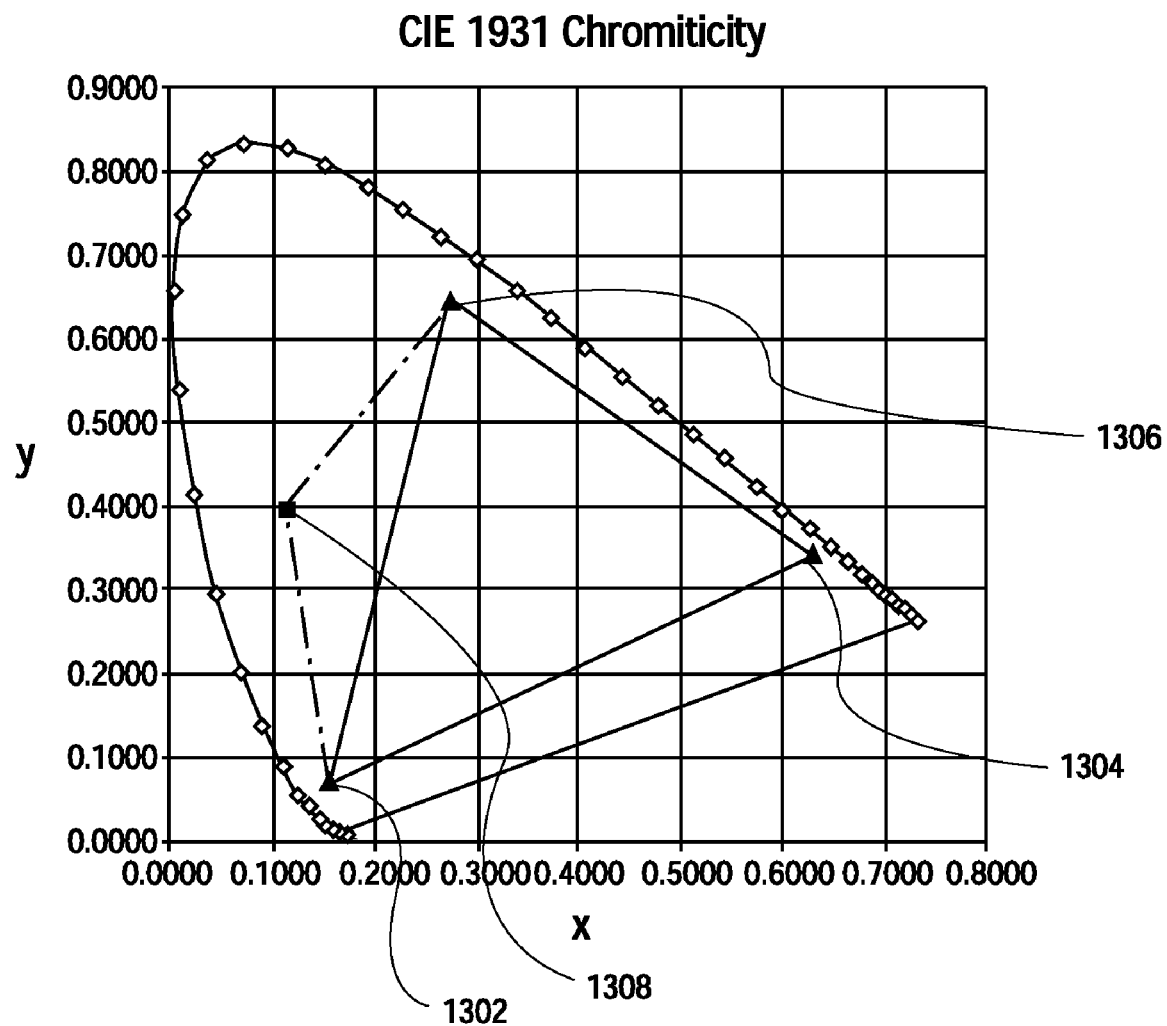
FIG. 13 is a chart showing the chromaticity coordinates of the emitter of another novel four color display.

Shown in FIG. 13, still another embodiment for choice of color and luminance points uses a deeper green 1306 than that shown in either FIG. 11 or 12. For example, green 1306 could be one that is further saturated and shifted towards the green corner, as described above. As an alternative, it might be possible to use the prior red color point 1304, prior art blue color point 1302 and luminance, and a cyan (or greenish-blue, bluish-green) color 1308 allowing both blue and green (short and medium wavelength) light to pass through the filter. The result might provide a more pleasing white point for the display when all subpixels are turned on. Additionally, this panel may have the same brightness as a traditional three color panel. The panel may exhibit lower visibility of blue subpixel related artifacts, as will be explained further below.

The resulting display has the further benefit of having a greater range of colors, color gamut, than the conventional three color display panels. The traditional three colors create a color gamut triangular area formed by the boundaries (dark lines) running from red 1304, green 1306, and blue 1302 color points. The addition of a fourth cyan color, outside the traditional boundary, extends the boundary (dash dot line) to include the space formed by the triangle running from the blue 1302, green 1306, and cyan 1308 color points.

Figure 14:
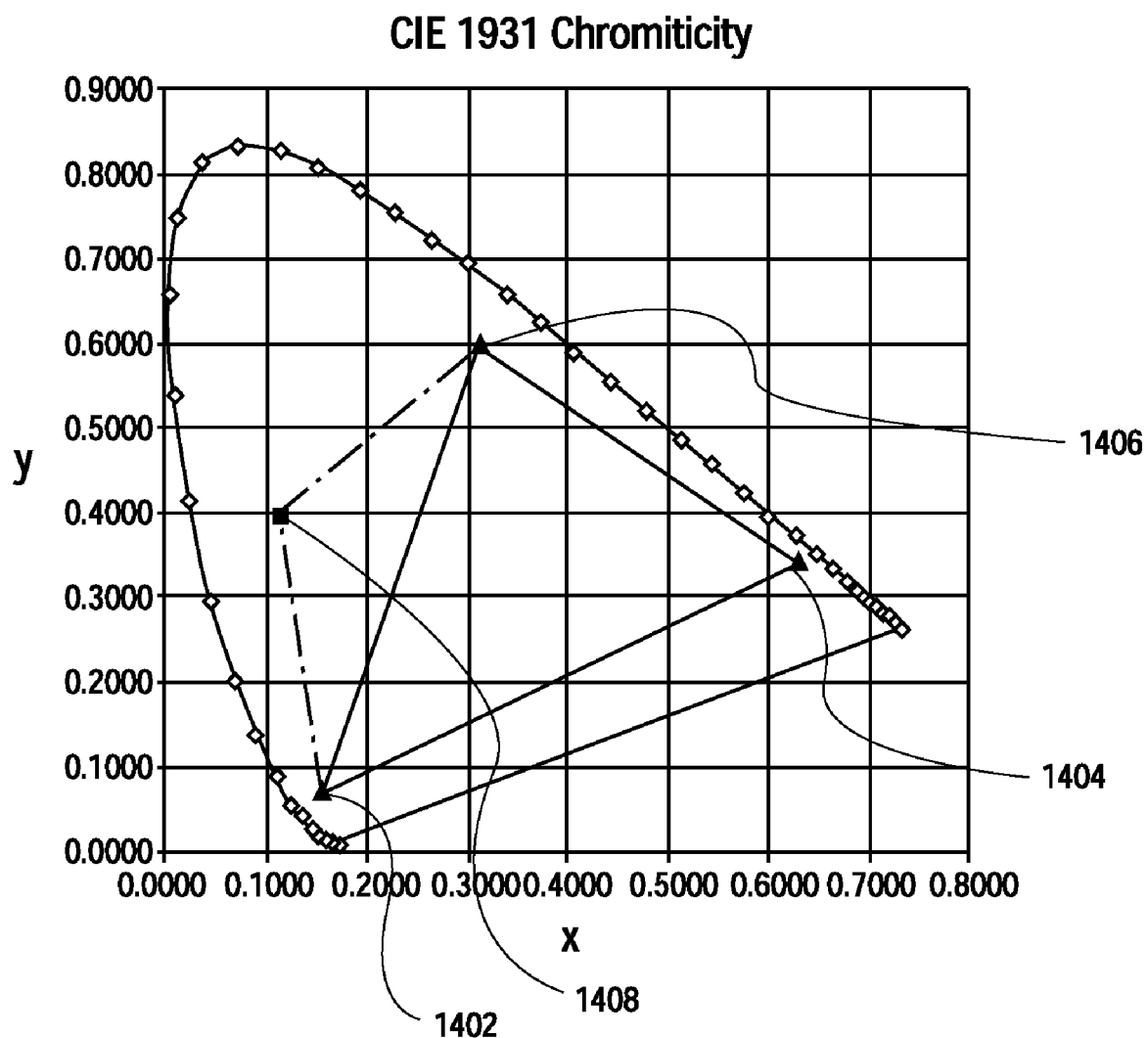
FIG. 14 is a chart showing the chromaticity coordinates of the emitter of another novel four color display.

Yet another embodiment for choice of colors is shown in FIG. 14. Here the traditional red 1404, green 1406, and blue 1402 may be chosen, but the green emitter subpixel has a lower luminance via one or more of the proposed methods above or by any other suitable method or means, more closely approximating the luminance of the red emitter subpixel, and a cyan color 1408 allowing both blue and green (short and medium wavelength) light to pass through the filter, having a luminance approximating the luminance of the red and/or green emitter subpixel, the goal and result being a pleasing white point for the display when all subpixels are turned on. The panel may have the same brightness as a prior art three color panel. The panel will exhibit lower visibility of blue subpixel related artifacts as will be explained further below.

The resulting display has the further benefit of having a greater range of colors, color gamut, than the prior art display panels, as described above.

Another embodiment for choice of colors is shown in FIG. 20. Here the traditional red 2004 and green 2006 may be chosen, but the green emitter subpixel has a lower luminance via one or more of the proposed techniques above or by any other suitable techniques, more closely approximating the luminance of the red emitter subpixel. Cyan color 2008—allowing both blue and green (short and medium wavelength) light to pass through the filter—is opposed to the red color 2004 and a purple or magenta color 2002 is opposed to the green color 2006, both colors having a luminance approximating the luminance of the red and/or green emitter subpixel, the result being a pleasing white point for the display when all subpixels are turned on. The panel may have the same brightness as a prior art three-color panel. In this embodiment, the color points of the green 2006 and magenta 2002 may be selected to provide a pleasing white point 2020 when the two colors are turned on full brightness, while the same may be true of the red and cyan. This creates two dichromatic metamers—i.e. combinations of just two colors, that both produce white—as well as the tetra chromatic metamer—i.e. the combination of all four colors, that produces white. The perception of a blue color 2009 may be produced by a suitable combination of intensities from the cyan 2008 and magenta 2002.

While it is appreciated that many positional combinations are possible, all of which are contemplated in the present invention, certain combinations are worth noting for their properties. For example, placing a pair of the dichromatic metamers on the 'checkerboard' at the majority subpixel locations, and the other dichromatic metamer on the minority subpixel locations of FIGS. 3, 4, 5A, 6A, 7A, 8A, 9, 10, and 19 will create a panel in which every column may create a narrow, single subpixel wide white line when turned on by itself, and narrow, single subpixel wide white lines in rows when only the majority subpixels are turned on. This property may allow for very high subpixel rendering performance, especially for black text on white backgrounds, as is performed.

In one embodiment, the arrangement of subpixels shown in FIG. 3, when the fourth color 308 has sufficient luminance, approximately that of the red 304 and/or green 306, or somewhere between them, the visibility of the dark blue 302 subpixels is reduced compared to an arrangement where the fourth color 308 is the same color as the blue 302. This is because in this latter case, dark blue stripes formed by the two subpixels 302 and 308 would be seen against a bright background formed by the red 304 and green 306 subpixels. Such dark stripes are strongly visible because the two dimensional spatial frequency Fourier Transform shows a single strong signal at one point in the horizontal axis. The visibility of the blue subpixels of the arrangement shown in FIG. 3 is reduced by the presence of the higher luminance fourth color, compared to one with blue stripes, first by the fact that half of the total "dark" signal energy is present and secondly because much of the energy is scattered into both the horizontal and vertical axis while some is scattered into the diagonal at a lower spatial frequency.

In another embodiment, the arrangements of the present invention may be improved by using the Active Matrix Layout techniques as disclosed in co-pending and commonly assigned U.S. patent application Ser. No. 10/024,326, US Patent Publication No. 2004/0046714 ("the '714 application), entitled "Improvements to Color Flat Panel Display Sub-Pixel Arrangements and Layouts" to Elliott and herein incorporated by reference—in which the Thin Film Transistors and/or their associated storage capacitors 510 are grouped together closely, into a low luminance structure that is substantially 180° out of phase with the blue subpixels, thus increasing the apparent spatial frequency of the low luminance spots formed by the blue subpixels. These arrangements are shown in FIGS. 5B, 6B, 7B, and 8B as illustrations. It will be appreciated that these TFT and capacitor groupings might apply to the other embodiments described herein.

Figure 4:
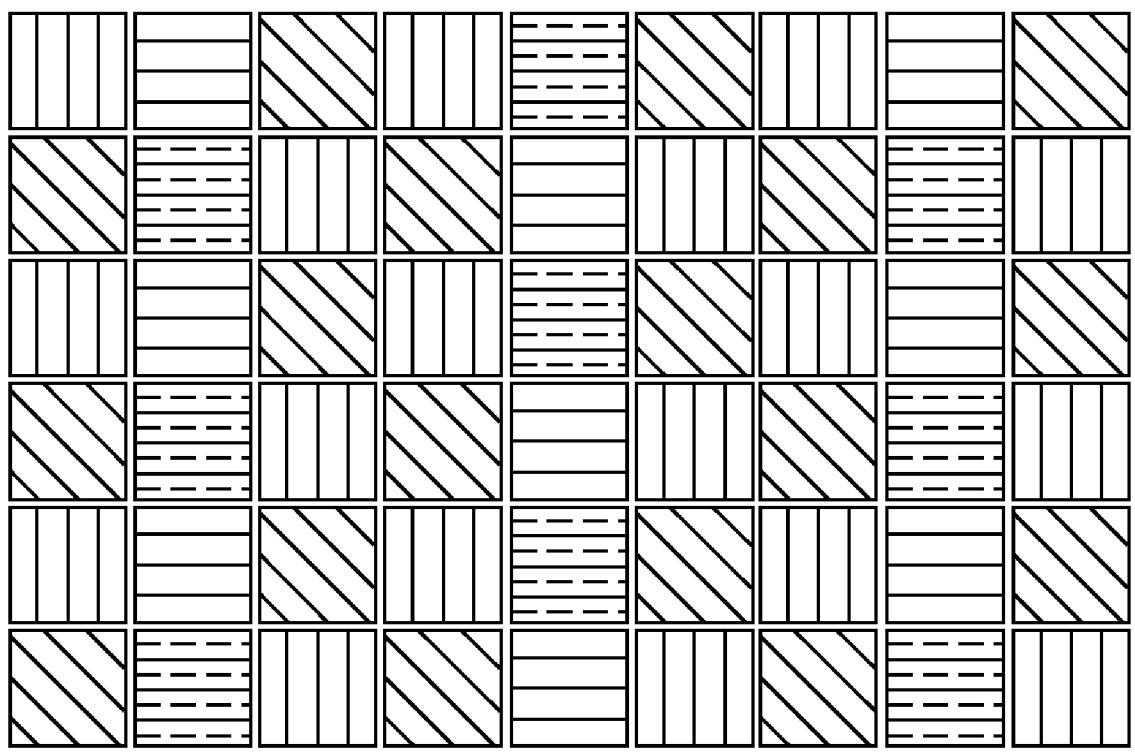
FIG. 4 shows another novel arrangement of four colors.
Figure 5A:
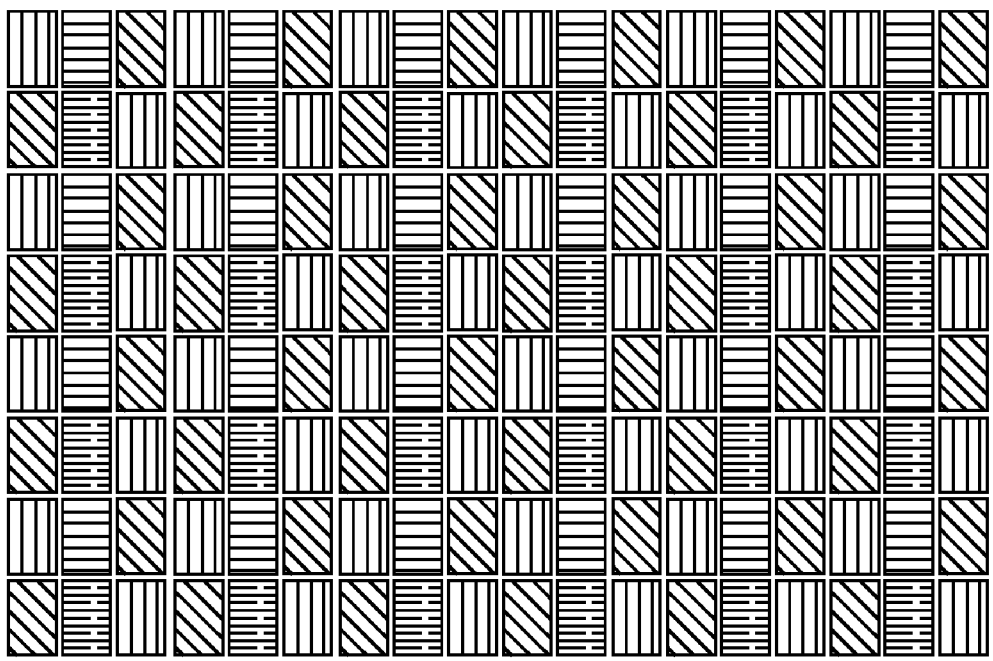
FIG. 5A shows the arrangement of FIG. 3 with rectangular, non-square, subpixels.
Figure 6A:
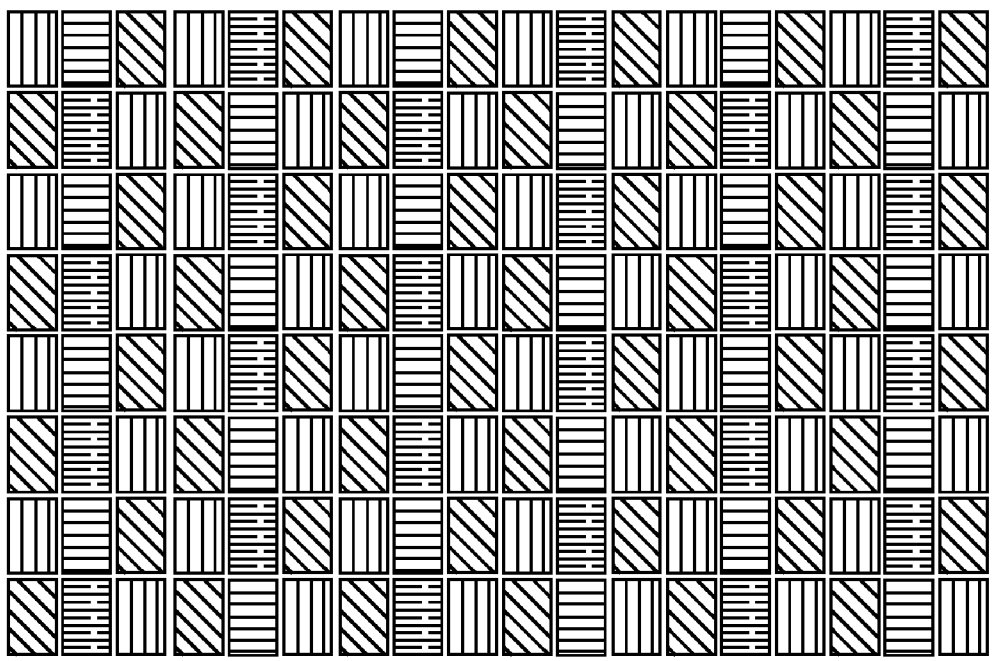
FIG. 6A shows the arrangement of FIG. 4 with rectangular, non-square, subpixels.
Figure 5B:
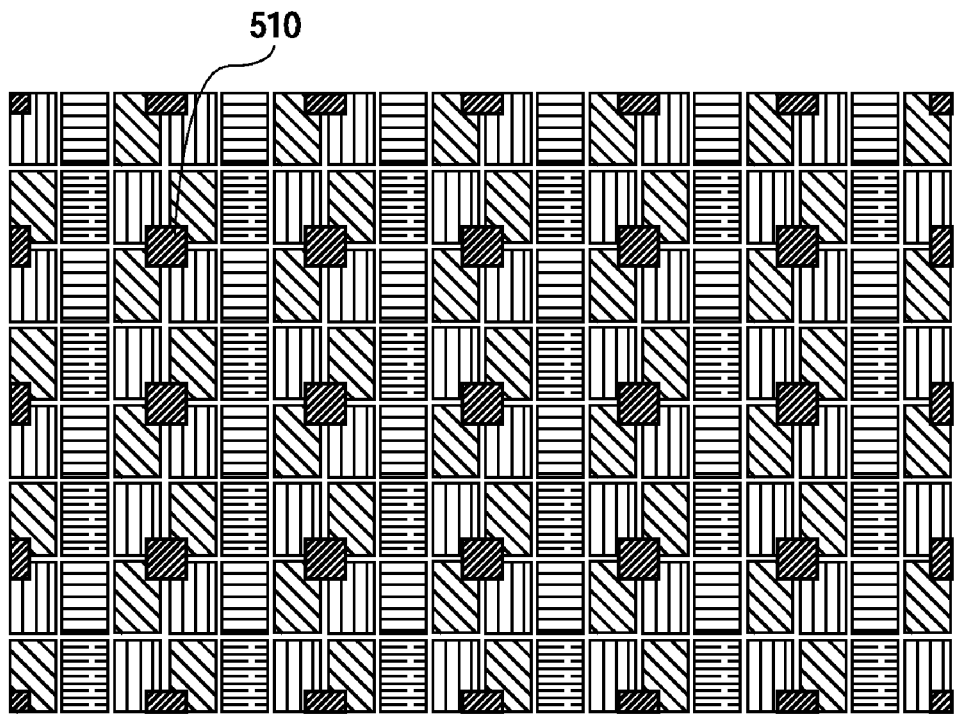
FIG. 5B shows the arrangement of FIG. 5A with an embodiment of thin film transistors and/or associated storage capacitors comprising thereof.
Figure 6B:
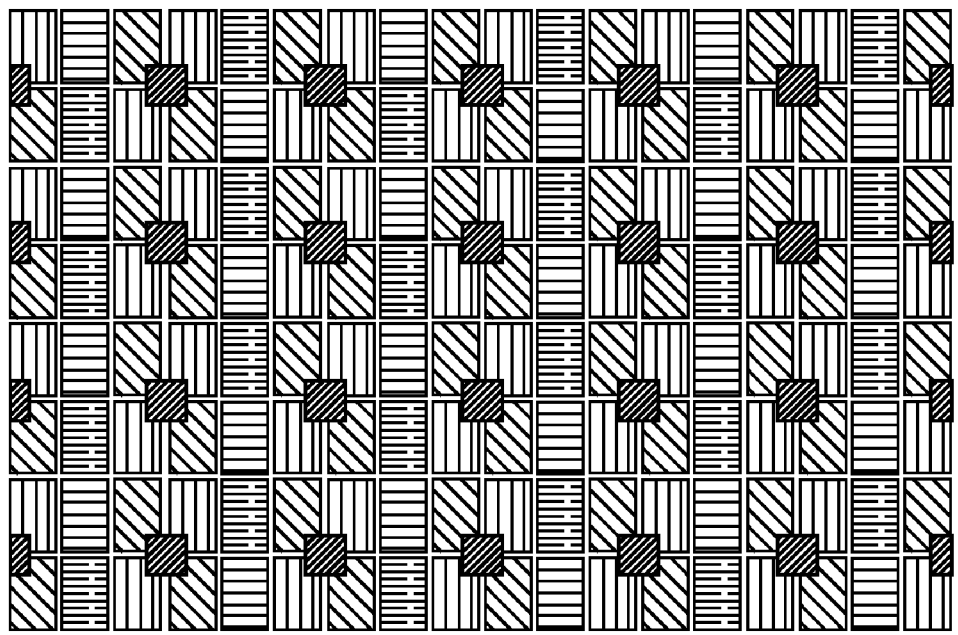
FIG. 6B shows the arrangement of FIG. 6A with an embodiment of thin film transistors comprising thereof.

In yet another embodiment, the visibility of the dark blue stripes may be further reduced by switching the position of the blue and the fourth color every other column in which they reside as shown in FIG. 4. This will scatter the bulk of the "dark" Fourier energy into the three directions with some scattered into three more directions between the first three at a lower spatial frequency. With increasing division of the Fourier energy, the visibility is reduced as each spatial frequency that has energy has less visibility, the total energy being constant.

In FIGS. 5A-5B and 6A-6B, non-square subpixels are used as separate embodiments. These are the same relative arrangements of color emitter subpixels as FIGS. 3 and 4 respectively, but with a different repeat cell aspect ratio. The aspect ratio of the repeat cell may be adjusted as desired. One possible repeat cell aspect ratio is that of one-to-one (1:1), that is, a square. A different ratio is shown in FIGS. 5A-5B, 6A-6B, 7A-7B, 8A-8B, 9, and 10. This aspect ratio naturally results in the subpixels having the aspect ratio of two-to-three (2:3) as shown in the above Figures, save for the purposefully altered subpixel areas and aspect ratios of the minority color subpixels shown in FIGS. 9 and 10.

FIGS. 7A-7B and 8A-8B show the similar arrangements as FIGS. 5A-5B and 6A-6B respectively, save that the minority colors are shifted by some amount. These may be shifted by half the subpixel length, placing the colors 180° phase shifted from the majority subpixels. The advantage of this may be that these subpixels may reconstruct high spatial frequencies with phases other than the majority subpixels in the vertical direction. The mere presence of the minority subpixels between the majority subpixels might allow these phases to be reconstructed. Spatial frequencies can be represented up to the Nyquist Limit as is well known in the art. However, that spatial frequency should be in phase with the sample and reconstruction points or the modulation depth may be reduced. If they are 180° out of phase, then the modulation depth is zero. With the shifted minority subpixels, spatial frequency image components of all phases may be represented, with non-zero modulation depth, up to the Nyquist Limit by the display. This improves the perceived image quality of the display considerably.

Figure 7A:
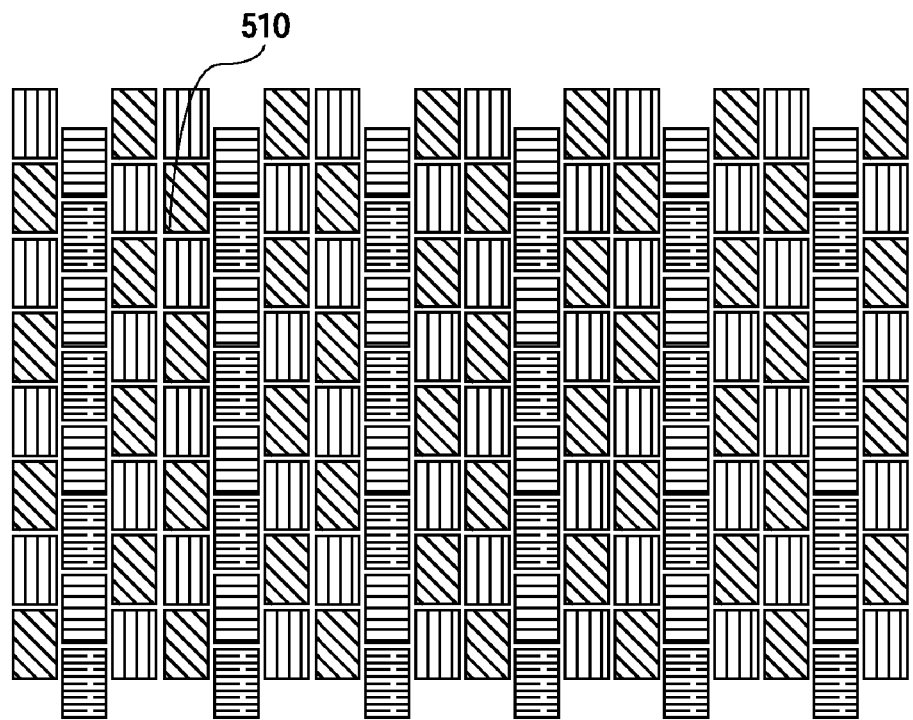
FIG. 7A shows another novel arrangement of four colors.
Figure 8A:
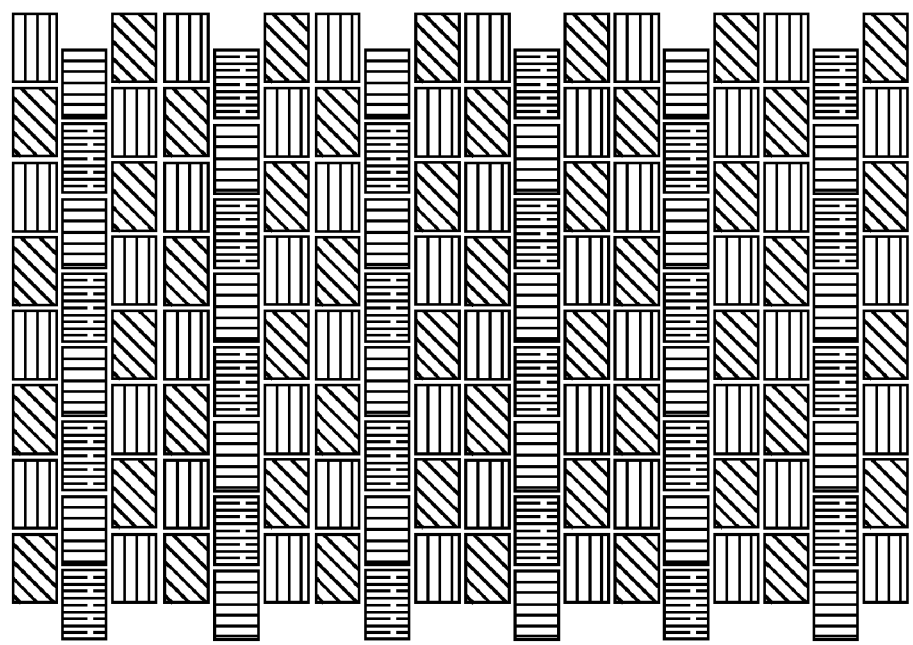
FIG. 8A shows another novel arrangement of four colors.
Figure 7B:
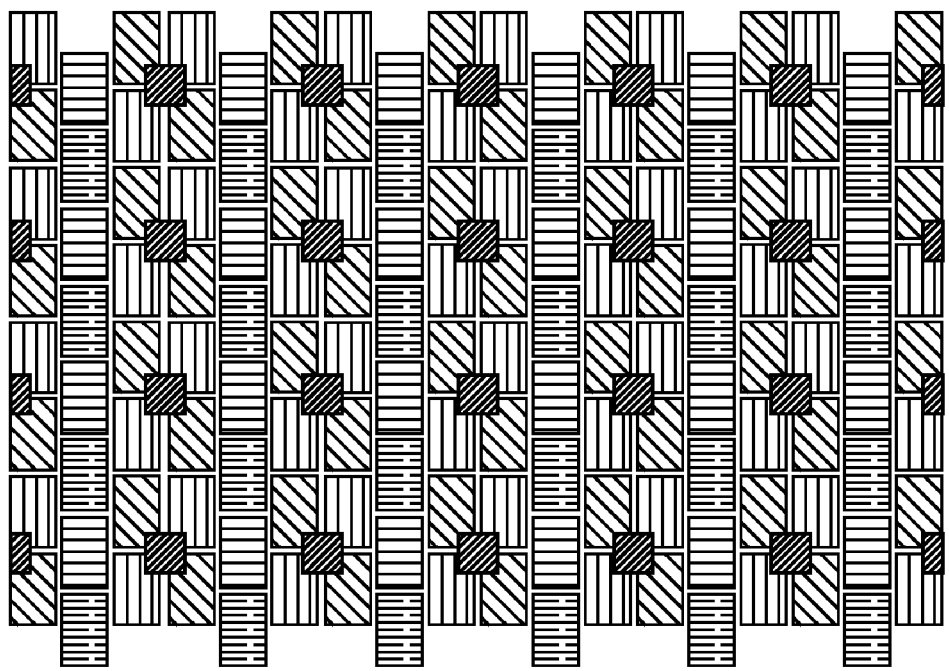
FIG. 7B shows the arrangement of FIG. 7A with an embodiment of thin film transistors comprising thereof.
Figure 8B:
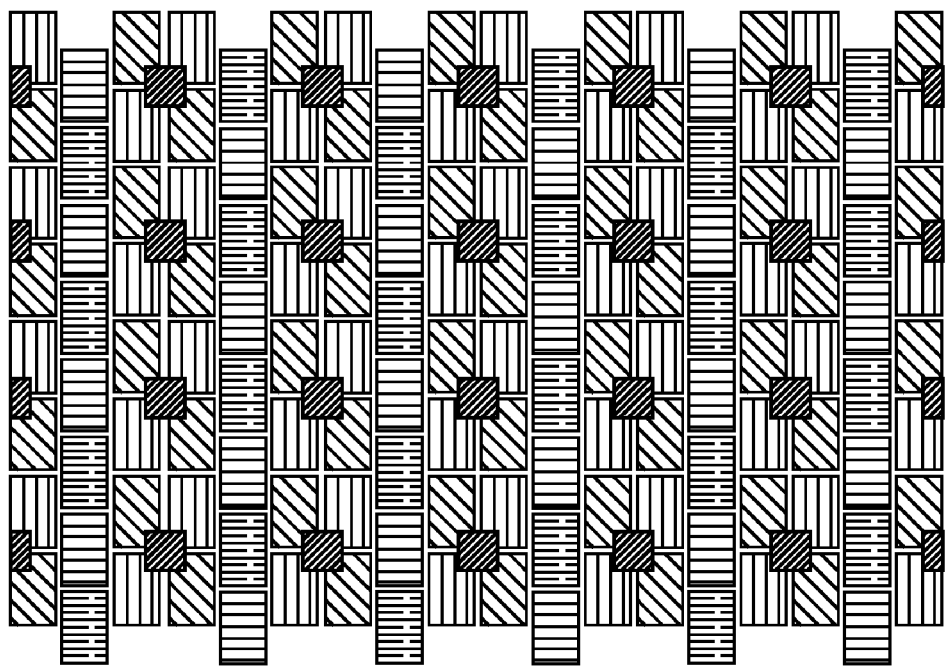
FIG. 8B shows the arrangement of FIG. 8A with an embodiment of thin film transistors comprising thereof.

The arrangements of FIGS. 7A-7B may have the advantage that the reconstruction points that the subpixels represent are four fold rotationally symmetrical, which enable rotation of the display as disclosed in copending and commonly assigned U.S. patent application Ser. No. 10/150,394, US Patent Publication No. 2002/0186229 ("the '229 application), entitled "ROTATABLE DISPLAY WITH SUB-PIXEL RENDERING" to Elliott and herein incorporated by reference. The arrangement of FIGS. 8A-8B may have the advantage of further reduced blue pixel visibility as described above.

Figure 9:
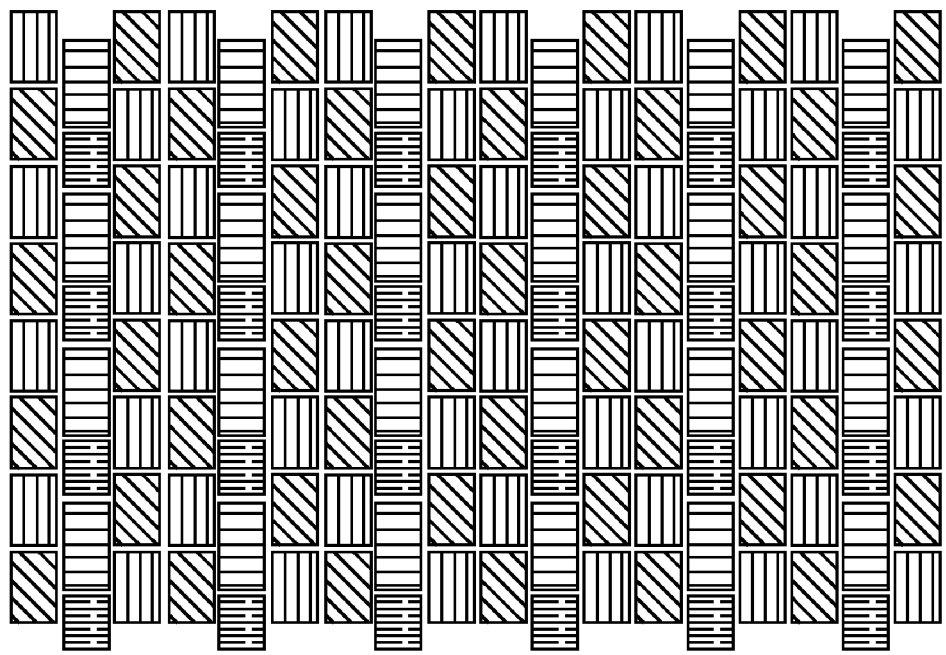
FIG. 9 shows the arrangement of FIG. 7 with a subset of the pixels smaller than the others, and a subset larger than the others.
Figure 10:
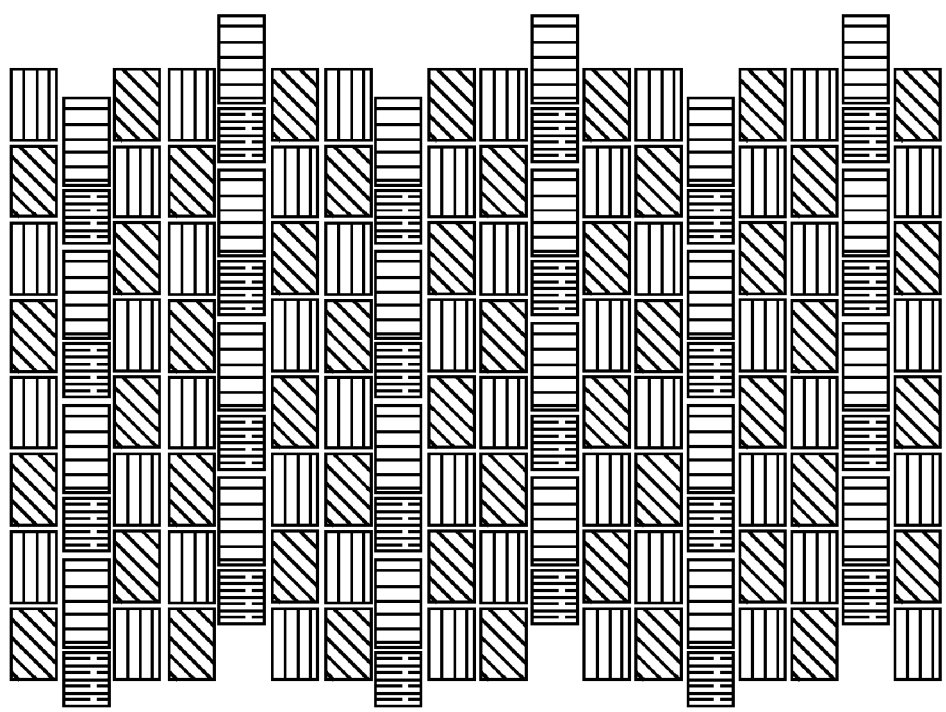
FIG. 10 shows the arrangement of FIG. 8 with a subset of the pixels smaller than the others, and a subset larger than the others.

In FIGS. 9 and 10, as separate embodiments, the minority subpixels have unequal areas. These embodiments allow one subpixel to emit more light of that color. This may be useful when more light of one of the minority colors is desired without increasing its per area luminance. For example, this technique may be used to increase the amount of pure blue light such that the resulting display may display bright saturated blue images. Alternatively, the smaller of the two minority subpixels may have an increased luminance to compensate for the decreased area.

FIGS. 15, 16, 17, and 18 show embodiments in which a fourth-color element is fabricated as an integral part of another color subpixel. This may have the advantage that the fourth-color, being of greater luminance than the conventional color, e.g. blue, will break up the stripe pattern, sending the "dark" Fourier energy into various directions to reduce the visibility of the dark stripe as earlier described. It is to be appreciated that the relative areas of the two colors may be adjusted depending on the amount of "dark" stripe visibility reduction desired and the reduction of first color saturation tolerable.

Figure 15:
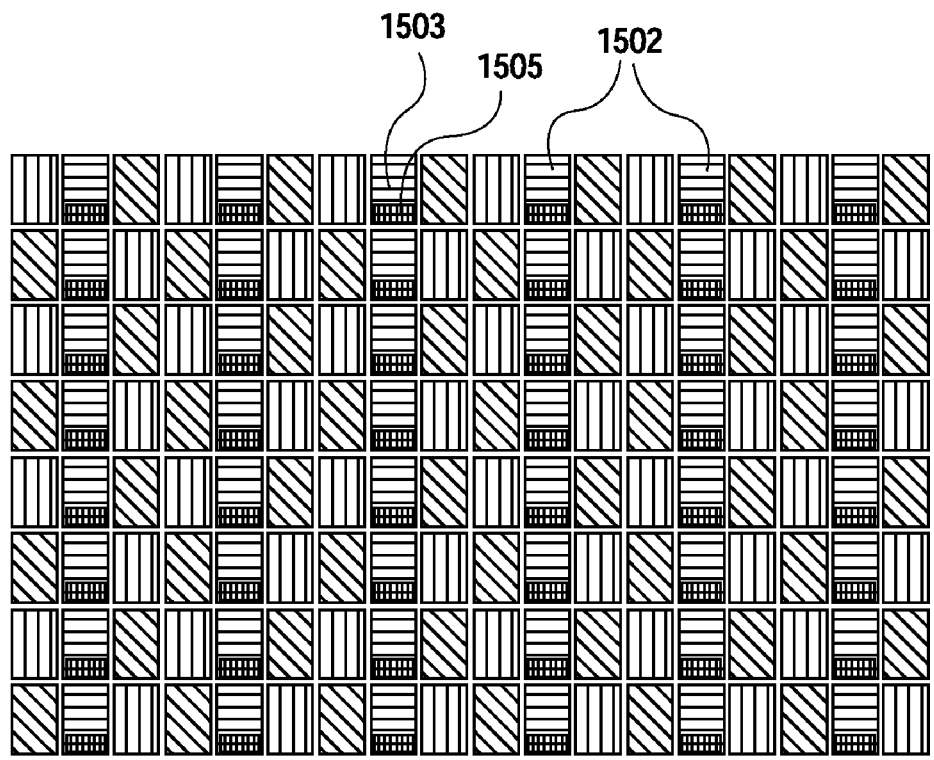
FIG. 15 shows a novel arrangement of colors in which some of the subpixels have two colored regions.

FIG. 15 shows a plurality of subpixels 1502 comprising two color regions, one being a first color 1503 and a second color 1505. The first color region 1503 may be a "dark" color, e.g. blue. The second color region may be chosen to be one with a higher luminance has as described above. In this embodiment, each of the subpixels comprising the first color also has the second color, each in the same relative positions and area.

Figure 16:
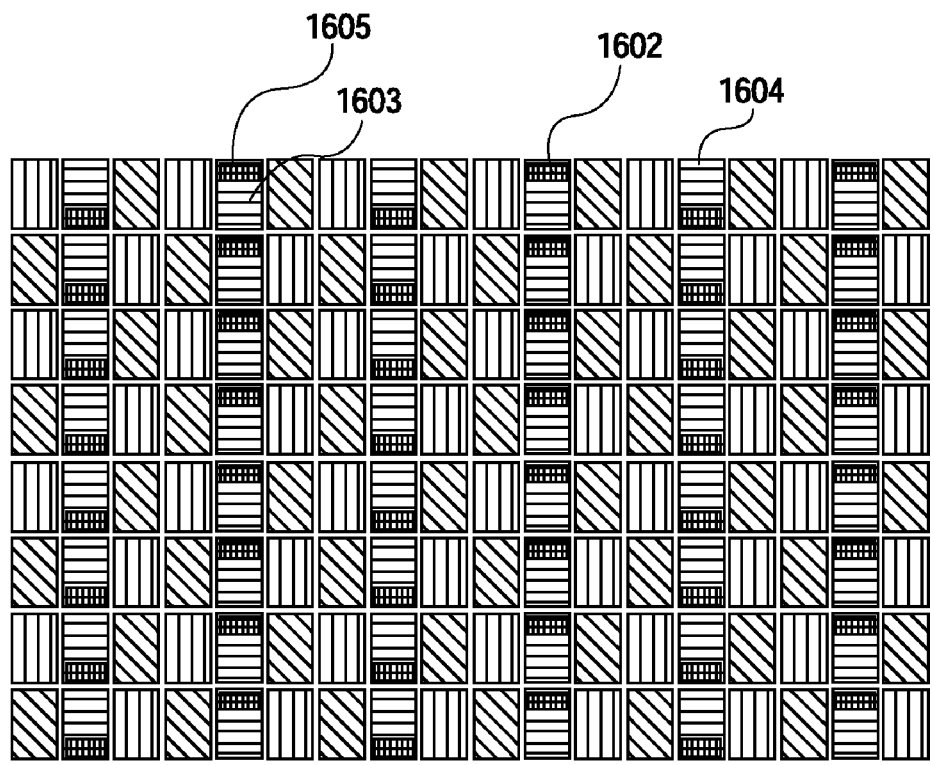
FIG. 16 shows another novel arrangement of colors in which some of the subpixels have two colored regions.

FIG. 16 shows a similar arrangement of subpixels 1602 and 1604 that comprise two colored regions 1603 and 1605. In this embodiment, the relative positions are shifted. Although the drawing shows only two relative positions, it will be appreciated that there is no limit on the number of relative positions of the two colored regions within the subpixels. As shown, one set of two color subpixels 1604 has the second color 1605 substantially on the lower portion of the subpixel, while the second set of two color subpixels 1602 has the second color 1605 in the upper portion of the subpixel. This particular arrangement further scatters the "dark" Fourier energy into additional directions as described above. In addition, the second color regions 1605, having luminance and being in more than one relative position within the subpixels 1602 and 1604, allow for additional subpixel rendering luminance reconstruction points. The second colored regions 1605, being in positions that place them off of the grid formed by the centers of the majority subpixels (e.g. the red/green checkerboard), allows for reconstruction of image signals that are various phases up to the Nyquist Limit as earlier described.

Figure 17:
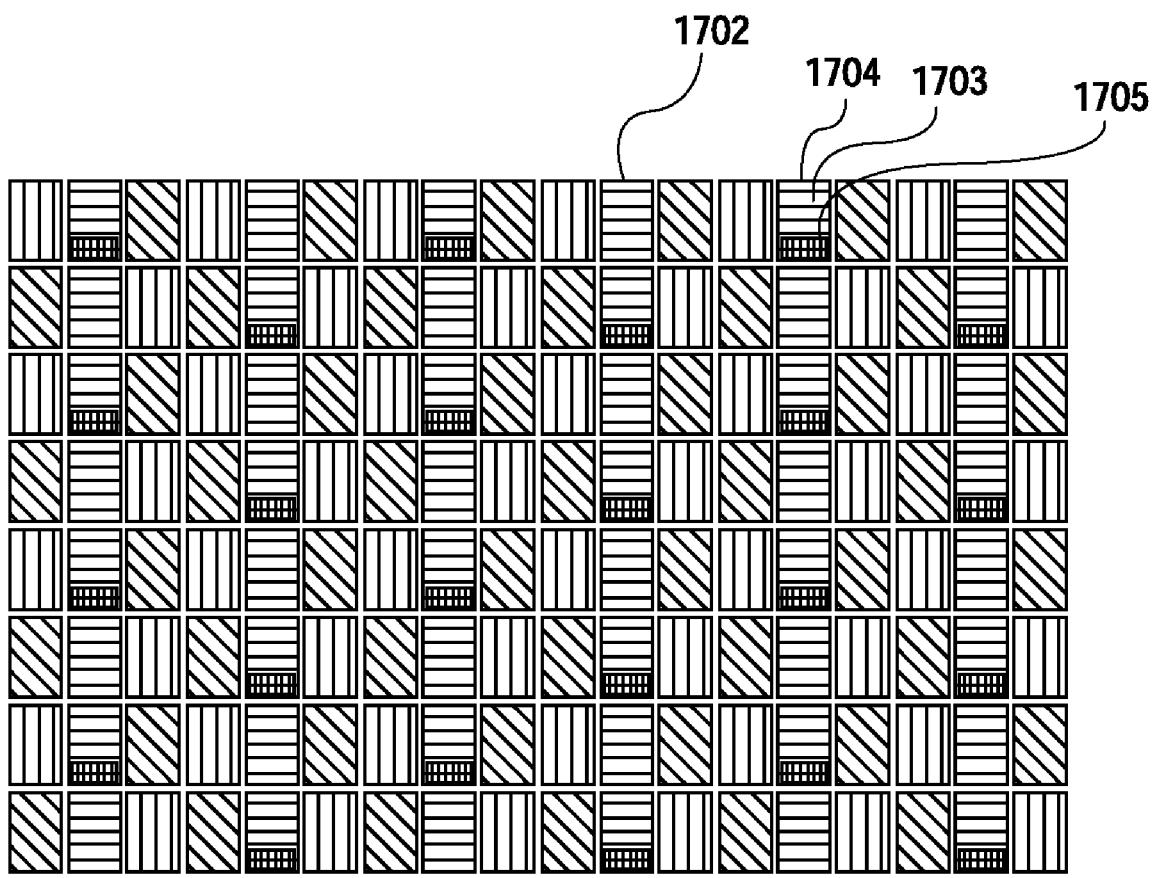
FIG. 17 shows another novel arrangement of colors in which some of the subpixels have two colored regions.

FIG. 17 shows two classes of minority subpixels 1702 and 1704. The first class of subpixels 1702 is that of a single color. The second class 1704 is comprised of two colored regions 1703 and 1705. The first colored region 1703 may comprise the same color as that of the first class 1702 of subpixels. By having two classes, the benefits of the added luminance breaking up the "dark" stripes is gained while simultaneously maintaining the ability to display a saturated first color.

Figure 18:
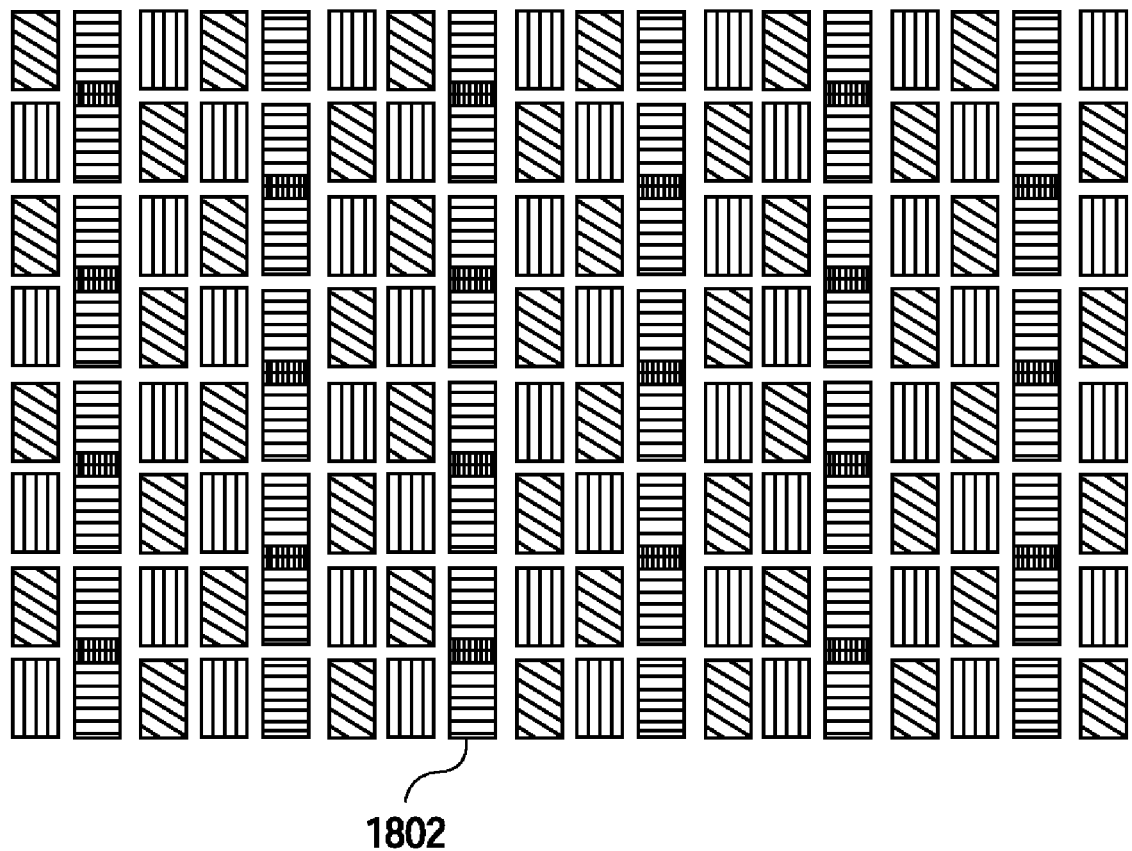
FIG. 18 shows yet another arrangement of colors in which some of the subpixels have two colored regions.

FIG. 18 shows an embodiment in which there are fewer of the two color subpixels 1802, allowing a reduction of driver count as was disclosed in copending and commonly assigned U.S. patent application Ser. No. 09/916,232 entitled "Arrangement of Color Pixels for Full Color Imaging Devices with Simplified Addressing" to Elliott and herein incorporated by reference.

Figure 19:
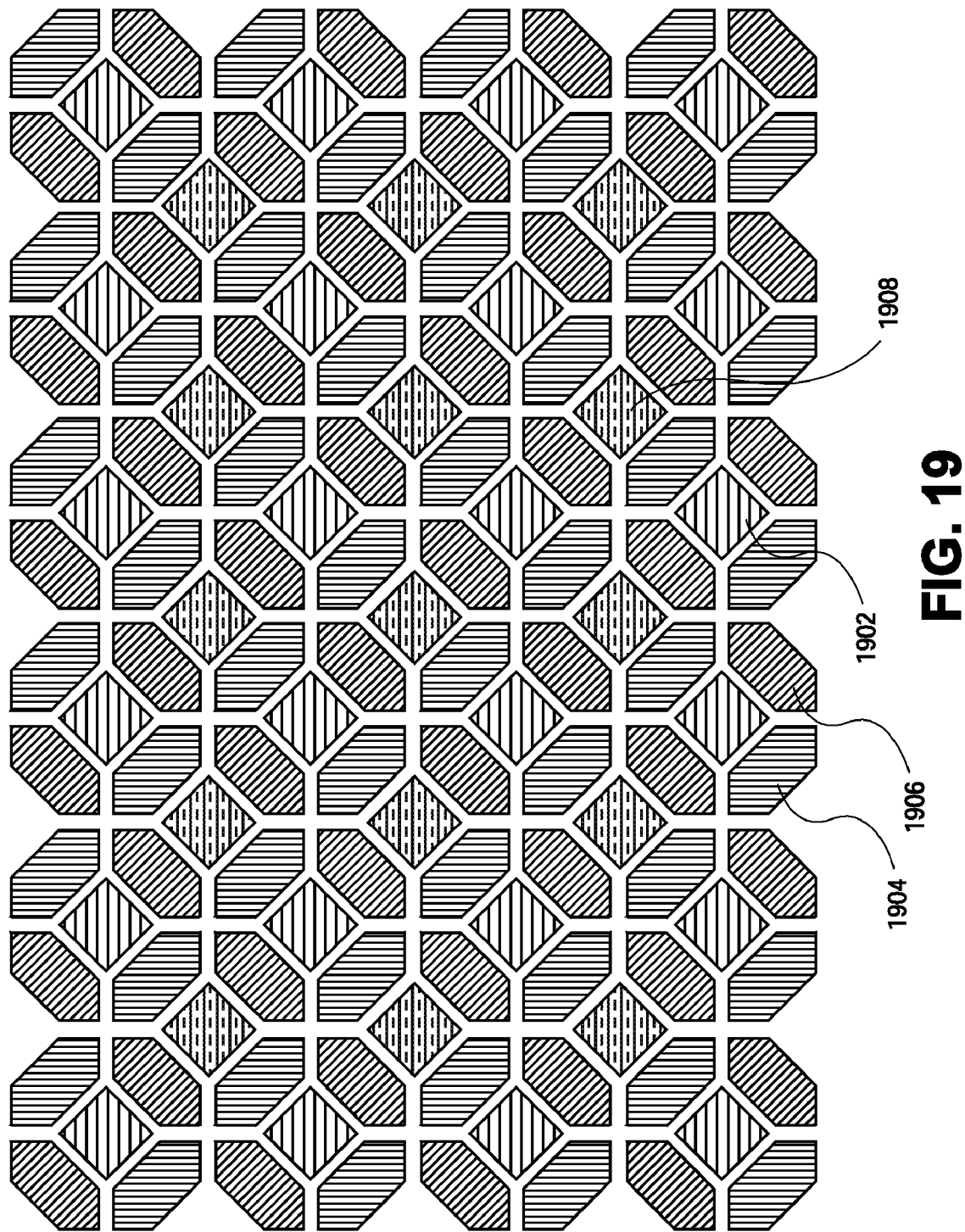
FIG. 19 shows a novel arrangement of four colors consisting of a repeat cell of six subpixels.

FIG. 19 shows a novel layout of four colors according to another aspect of the present invention. The arrangement uses two majority colors 1904 and 1906 in a checkerboard. These two colors may be substantially red and green. One of the minority colors 1902 or 1908 may be blue. The other minority color 1908 or 1902 respectively may be chosen from a group of fourth-colors as described above. One advantage of this arrangement is that the majority color subpixels are on a rectangular and/or square grid, while the minority colors are 180° out of phase with that checkerboard grid. The fourth-color, which may have appreciable luminance, may provide for reconstruction of signals which are out of phase with the majority color subpixel checkerboard. The minority subpixels 1902 and 1908 may be the same color, e.g. blue, as a possible embodiment.

Although it might be desirable for all of the subpixel emitters to have the same luminance, for various reasons, this may not be practical. For instance, the blue emitting subpixels may be lower luminance than the emitters of other colors, or the green or the fourth color (white, cyan, or blue-grey) may be higher luminance than the other colors. In these cases, some of the objectionable artifacts caused by the differences in luminance may be reduced with the use of a suitably selected optical low-pass spatial filter. This low-pass spatial filter may blur the edges of the subpixels, reducing the visibility of the sudden, undesired, change in luminance between the subpixel color emitters. Such a filter may further comprise or include an anti-glare function, the surface of the filter scattering reflected light to avoid specular reflections. The filter may also comprise a Holographic Optical Element (HOE) that scatters or blurs the light emitted by the display. Both of the above said filter types are commercially available.

The amount of scatter or blur may be a function of both the display subpixel density and the distance from the light modulation plane. As a general rule, the higher the density, the higher the resolution may be; and the lower the total blur required to achieve the effect. Additionally, the further the blur filter plane is from the light modulation plane, the lower the intrinsic blurring power (i.e. higher spatial frequency pass) of the filter is required. Generally speaking, the amount of blur required to improve the appearance of the subpixel rendered display is a bit more than is currently provided by the presence of conventional anti-glare filters. Two further embodiments of increasing blur to a suitable level are; increasing the intrinsic scattering of the anti-glare filter, or; increasing the distance between the light modulation plane and the anti-glare filter surface. This can be achieved by introducing a thicker film, or second film, between the filter and the display substrate.

The above use of transmissive liquid crystal displays is exemplary and not to be construed as restricting the scope of this invention. The present invention encompasses the scope of all such embodiments for adjusting the luminance and chrominance and positions of the emitters of non-transmissive display panels, such as reflective Liquid Crystal Displays, emissive ElectroLuminecent Displays (EL), Plasma Display Panels (PDP), Field Emitter Displays (FED), Electrophoretic displays, Iridescent Displays (ID), Incandescent Display, solid state Light Emitting Diode (LED) display, and Organic Light Emitting Diode (OLED) displays.

B. Subpixel Rendering Methods

Having described a number of novel four color subpixel arrangements, there will now be described some novel embodiments of methods and manners of performing subpixel rendering on those novel arrangements. It will be appreciated that the following description is given for two particular novel arrangements; however, other arrangements follow similarly and that the present invention contemplates and encompasses all suitable methods and modifications to the same to perform subpixel rendering on these other arrangements.

Three color (red, green, & blue) subpixel arrangements have a simple one-to-one mapping of the conventional three color plane data sets (RGB). Four color subpixel arrangements may not have that simple mapping. For example, the fourth color, often white, may be mapped as a function of several, perhaps all, of the three color planes.

Several embodiments are disclosed herein. One embodiment is meant to keep the computation as simple as possible to keep the cost of implementation low. Other embodiments provide successively higher image quality, trading off computation complexity.

One embodiment uses the same area resample theory as described in the '355 application wherein the resample areas are drawn to minimize the distance from any point in the input data image to the reconstruction point grid. This allows data areas to be represented by the closest reconstruction point. As described below, a novel method adds a fourth resample plane for the fourth-color. The resample areas overlap and cover the entire incoming data space, as though for its own color plane. Thus, if the incoming data comprises a four-color data format, then the shapes, and therefore, the filter coefficients are generated as per the method disclosed in the '355 application.

Figure 28:
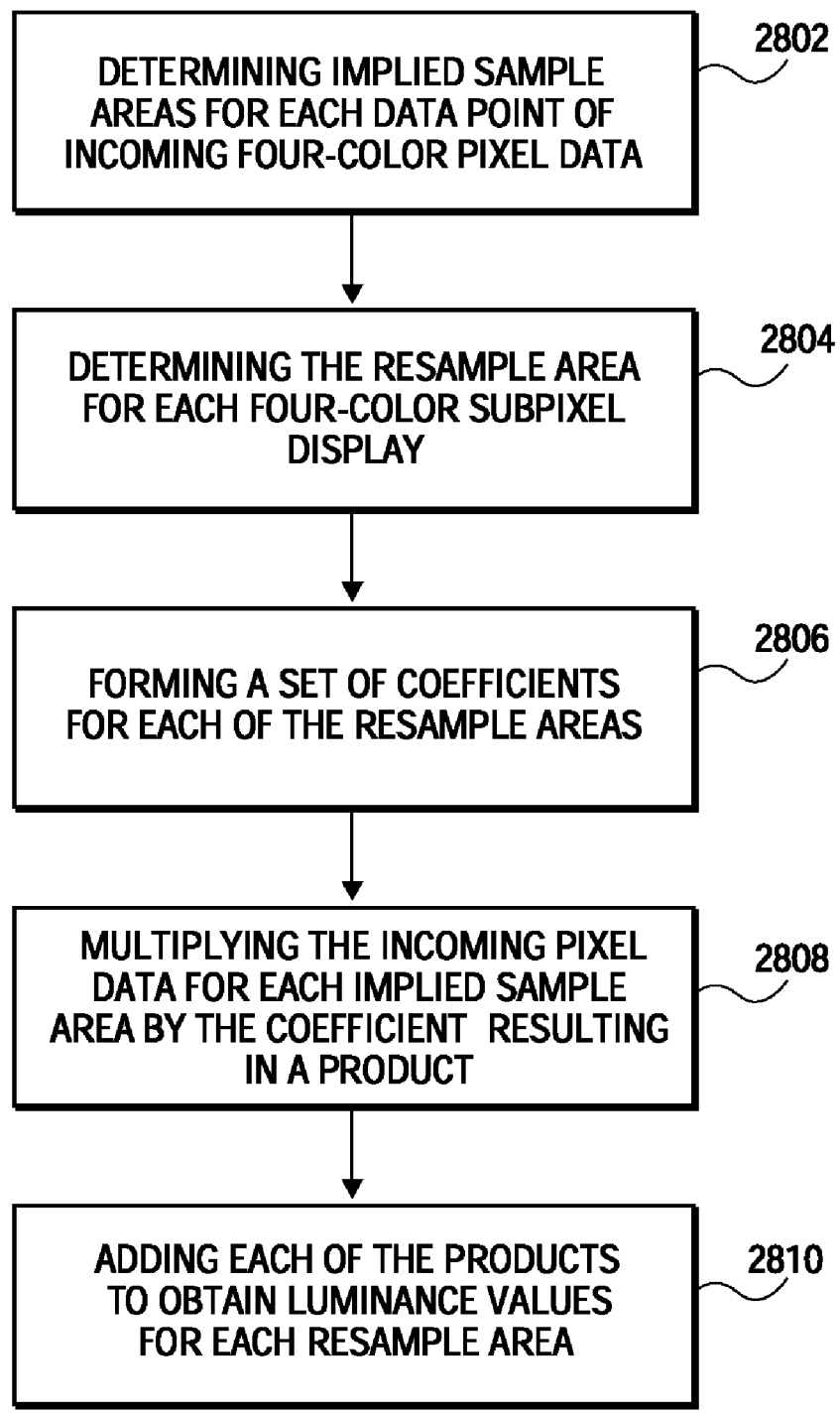
FIG. 28 is a flowchart of one embodiment for achieving subpixel rendering on a four-color subpixel arrangement.

As shown in FIG. 28, one embodiment of the method proceeds as follows: (1) determining implied sample areas for each data point of incoming four-color pixel data as in step 2802; (2) determining the resample area for each four-color subpixel in the display as in step 2804; (3) forming a set of coefficients for each said resample area as in step 2806, whereby one possible embodiment has said coefficients comprising fractions whose denominators are a function of the resample area and the numerators are a function of an area of each said implied sample areas that may partially overlap said resample areas; (4) multiplying the incoming pixel data for each implied sample area by the coefficient resulting in a product as in step 2808; and (5) adding each said product to obtain luminance values for each resample area as in step 2810.

If, however, there is no fourth-color data plane from which the fourth-color resample plane may resample, the fourth color resample area grid must therefore resample from the other color planes—as a refinement of step 2804. Assuming that the fourth-color is white, grey, or blue-grey, for each white, grey, or blue-grey subpixel the following equation is used to map the fourth color data:

$$W_{out} = M\text{in}(\Sigma(R_{in} \cdot C_k), \Sigma(G_{in} \cdot C_k), \Sigma(B_{in} \cdot C_k))$$

where $C_k$ is the filter coefficient matrix, $R_{in}$, $G_{in}$, $B_{in}$ are values of the red, green, and blue components of the input data set that the filter matrix is operating upon, and $W_{out}$ is the value to be applied to the white, grey, or blue-grey subpixel.

Another embodiment assumes that the incoming three-color input data match substantially three out of the four colors in the display. In operation, the filter coefficient is applied to each of the color channels separately, then the minimum color component value, (i.e., the color value that has the lowest value) is selected and applied to the white, grey, or blue-grey subpixel. The minimum is chosen to minimize the change in color saturation of the image, to maintain color saturation.

If the fourth-color is selected to represent a combination of only two color planes, for example, green and blue, by emitting light that represents these two colors together, such as cyan, then only two color planes are evaluated in calculating the value of the fourth-color subpixel:

$$C_{out} = M\text{in}(\Sigma(G_{in} \cdot C_k), \Sigma(B_{in} \cdot C_k))$$

Another embodiment uses smaller resample areas for the fourth-color subpixels. The total resample area does not cover the entire data space. This is to localize the effect of the data on the fourth color subpixels to increase the image sharpness. For example, the area of each fourth-color subpixel could be set equal to the area of each red and green subpixel, as it will have a similar effect on the reconstruction of the image. Such an arrangement is shown in FIG. 23.

The exact values of the subpixel rendering coefficient matrices depend on the input data set definition and scale, as was described in the '355 application. Summarizing here, the coefficients are generated by calculating the fractional coverage, or overlap, of each implied sample area for each input data point to the area of the resample area. FIG. 23 shows a conventional image data set overlaying a set of resample areas.

Figure 23:
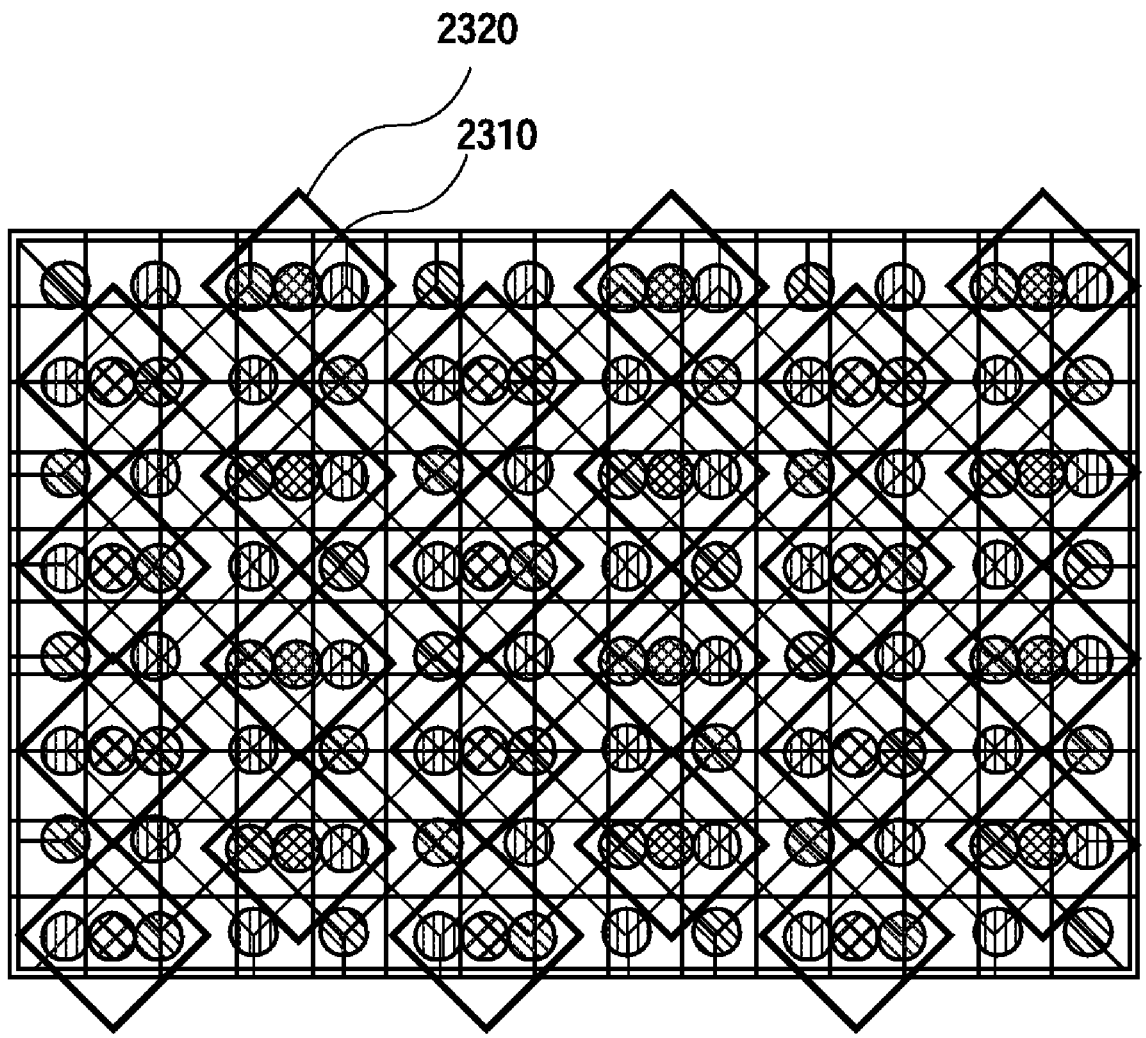
FIG. 23 shows the reconstruction points and a novel set of resample areas for the arrangement of FIG. 22 overlaid on a grid of implied sample areas of an input image data set in which one of the minority color plane reconstruction points is not shown for clarity.

Shown in FIG. 23 are the reconstruction points 2310 and one possible associated resample areas 2320. The blue resample areas are not shown for clarity. In one embodiment, there are areas where a primary color resample area overlaps the fourth-color resample areas, and areas where it does not. This creates two classes of sub-resample area. When data occurs in the overlap area, it is desirable for the fourth color subpixel to represent the data, shifting the luminance from the primary color to the fourth-color subpixel. However, as the fourth-color subpixel takes over this area, it is desirable to boost the effect of the non-overlap areas to keep color and brightness constant. This leads to the following formulas:

$$W_{out} = \min(\Sigma R_{in} \times c_k, \Sigma G_{in} \times c_k, \Sigma B_{in} \times c_k)$$

$$R_{out} = \Sigma c_{k1}(R_{in} - \tfrac{1}{2}W_{out}) + R_{in}(c_{k2} + (c_{k3} \times \tfrac{1}{2}W_{out}))$$

$$G_{out} = \Sigma c_{k1}(G_{in} - \tfrac{1}{2}W_{out}) + G_{in}(c_{k2} + (c_{k3} \times \tfrac{1}{2}W_{out}))$$

$$B_{out} = \Sigma c_{k1}(B_{in} - \tfrac{1}{2}W_{out}) + B_{in}(c_{k2} + (c_{k3} \times \tfrac{1}{2}W_{out})) \text{ OR}$$

$$B_{out} = \Sigma c_k B_{in}$$

where: $c_{k1}$ is the coefficient matrix for that portion that is overlapped by both the primary color resample area and the fourth color resample areas. $c_{k2}$ is the coefficient matrix for the portion that is not overlapped by the fourth resample areas with respect to the total resample area for that reconstruction point. It is noted that $c_{k3}$ is a modifier coefficient matrix whereby $c_{k2} + c_{k3} = c_{kx-w}$, where $c_{kx-w}$ is the coefficient matrix that would be generated if the primary color resample area were restricted to only that area not overlapped by the fourth-color resample areas.

The form of the expression allows the luminance energy in the overlapping resample area to be transferred to the fourth-color, while simultaneously increasing the effect of the non-overlapped area to ensure that when a full white field is present, that all of the subpixels are turned on full. The use of the constant of "one half (½)" as a multiplier for the fourth color data is because when the fourth color "borrows" luminance from both the red and green, it replaces only one half of the combined red and green total. The choice of using the simple or more complicated form of the formula for the blue component depends on the level of accuracy vs. computational complexity and cost that is tolerable. The blue image component has negligible luminance and may exhibit greater color error before it is noted by the Human Vision System. Thus, the simplification for the blue data may be acceptable.

As before, where the fourth-color only represents two of the color planes, for example, blue and green, by using a cyan as the fourth-color, the algorithm is given below, wherein $W_{out}$ is the energy applied to the cyan color:

$$W_{out} = \min(\Sigma G_{in} \times c_k, \Sigma B_{in} \times c_k)$$

$$R_{out} = \Sigma c_k R_{in}$$

$$G_{out} = \Sigma c_{k1}(G_{in} - W_{out}) + G_{in}(c_{k2} + (c_{k3}W_{out}))$$

$$B_{out} = \Sigma c_k B_{in}$$

Figure 22:
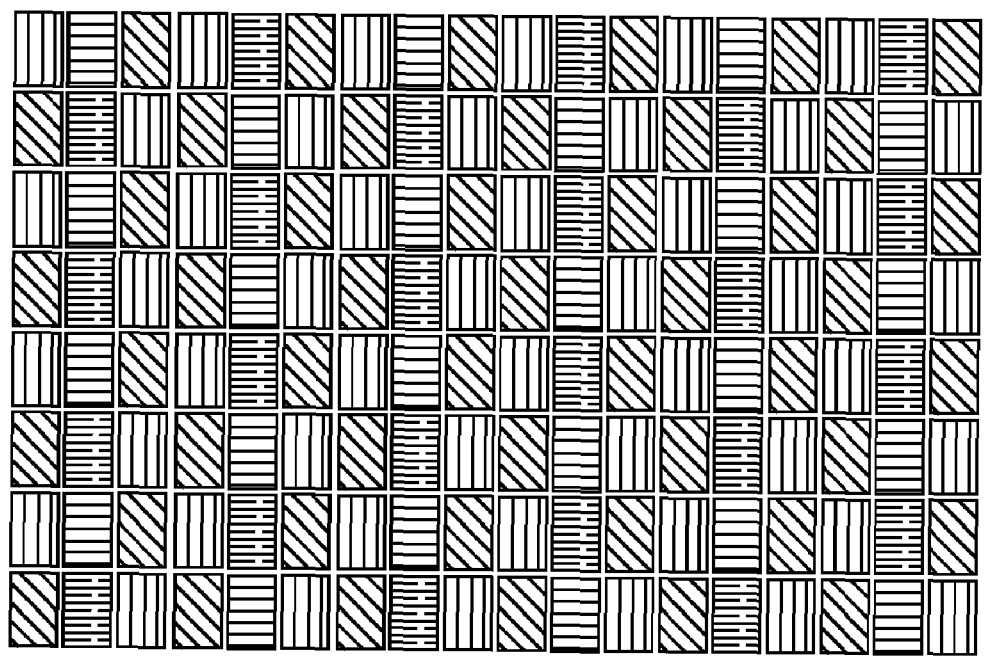
FIG. 22 shows another novel arrangement of four colors.
Figure 24A:
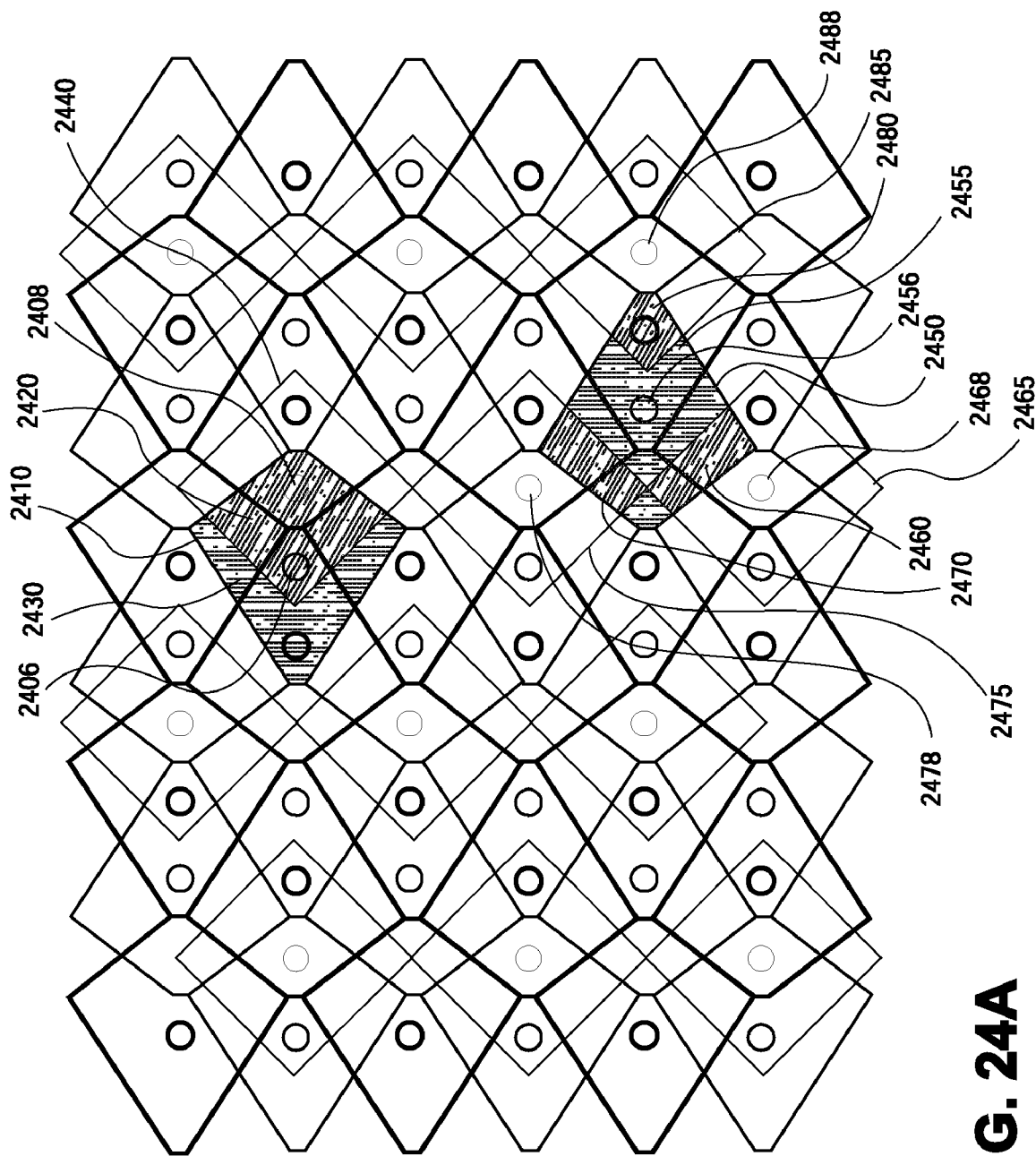

The resample areas shown in FIGS. 24A and 24B treat all of the reconstruction areas exactly in the center of the colored subpixels shown in FIG. 22, as opposed to the resample areas shown in FIG. 23 that treat the red and green reconstruction points as though they were on an idealized checkerboard for computational simplicity. The value of treating the reconstruction points exactly is that the fourth-color subpixels, when considered along side the majority subpixels, may reconstruct the phase relationships of scaled input image data sets better than the idealized checkerboard of FIG. 23.

Examining the meaning and relationships between the various coefficient matrices, using the example of the resample areas in FIGS. 24A and 24B: A randomly chosen example green reconstruction point 2406 has an associated resample area 2410. Next to it is a fourth-color reconstruction point 2408 and an associated resample area 2440. The resample area 2410 is divided into two sub-resample areas 2420 and 2430. The overlapping area 2420 of the fourth-color resample area 2440 and the green resample area 2410 is used to calculate the subpixel rendering coefficient matrix $c_{k1}$ for the green subpixel associated with the reconstruction point 2406. The non-overlapping green resample area 2430 is used to calculate the subpixel rendering coefficient matrices $c_{k2}$ and $c_{k3}$ for the green subpixel associated with the reconstruction point 2406.

Some, in this instance half, of the green and red resample areas will overlap more than one fourth color resample area. For example, another green reconstruction point 2456 has an associated resample area 2450. This resample area is divided in four sub-resample areas 2455, 2460, 2470, and 2480. The resample area 2450, overlaps three of the nearby fourth-color resample areas 2465, 2475, and 2485, associated with the nearby fourth-color reconstruction points 2468, 2478, and 2488 respectively. The overlaps of the green resample area 2450 and the nearby fourth-color resample areas 2465, 2475, and 2485, form the overlap areas 2460, 2470, and 2480 respectively. The existence of more than one overlap area with more than one fourth-color resample areas requires a modification to the above algorithms:

$$W_{out} = \min(\Sigma R_{in} \times c_k, \Sigma G_{in} \times c_k, \Sigma B_{in} \times c_k)$$

$$R_{out} = \Sigma c_{k1}(R_{in} - \tfrac{1}{2}W_{out}) + R_{in}(c_{k2} + (c_{k3} \times \tfrac{1}{2}W_{out})) \text{ OR}$$

$$R_{out} = \Sigma c_{k11}(R_{in} - \tfrac{1}{2}W_{out-1}) + c_{k12}(R_{in} - \tfrac{1}{2}W_{out-2}) + c_{k13}(R_{in} - \tfrac{1}{2}W_{out-3}) + R_{in}(c_{k2} + (c_{k31} \times \tfrac{1}{2}W_{out-1}) + (c_{k32} \times \tfrac{1}{2}W_{out-2}) + (c_{k33} \times \tfrac{1}{2}W_{out-3}))$$

$$G_{out} = \Sigma c_{k1}(G_{in} - \tfrac{1}{2}W_{out}) + G_{in}(c_{k2} + (c_{k3} \times \tfrac{1}{2}W_{out})) \text{ OR}$$

$$G_{out} = \Sigma c_{k11}(G_{in} - \tfrac{1}{2}W_{out-1}) + c_{k12}(G_{in} - \tfrac{1}{2}W_{out-2}) + c_{k13}(G_{in} - \tfrac{1}{2}W_{out-3}) + G_{in}(c_{k2} + (c_{k31} \times \tfrac{1}{2}W_{out-1}) + (c_{k32} \times \tfrac{1}{2}W_{out-2}) + (c_{k33} \times \tfrac{1}{2}W_{out-3})) \quad B_{out} = \Sigma c_k B_{in}$$

where: $c_{k11}$, $c_{k12}$, and $c_{k13}$, are the coefficient matrices for that portion that is overlapped by both the primary color resample area and the 3 fourth color resample areas. $c_{k2}$ is the coefficient matrix for that portion that is not overlapped by the fourth resample areas with respect to the total resample area for that reconstruction point. $c_{k31}$, $c_{k32}$, and $c_{k33}$, are modifier coefficient matrices whereby $c_{k2} + c_{k31} + c_{k32} + c_{k33} = c_{kx-w}$, where $c_{kx-w}$ is the coefficient matrix that would be generated if the primary color resample area were restricted to only that area not overlapped by the fourth color resample areas. $W_{out-1}$ and $W_{out-2}$ and $W_{out-3}$ are calculated the same as $W_{out}$ but from the three surrounding resample points—e.g. points 2468, 2478 and 2488.

Each implied sample area (for example, the orthogonal grid as shown in FIG. 23) from the input image data creates entries in the coefficient matrices. For each resample area, only the input data points that have an overlapping implied sample area have an entry in the associated coefficient matrix. Examining FIG. 24B, with reference where needed to FIG. 24A, an input image pixel's implied sample area 2415 is shown overlapping the green resample area 2410 and the fourth-color resample area 2440. The input sample area 2415 is subdivided by the two overlapping resample areas. One sub-area of the implied input sample area 2415 is the overlap of the input sample area 2415 and the intersection set overlap 2420, that is itself the overlap of the green resample area 2410 and the fourth-color resample area 2440, to form a new, triple intersection set area 2425. This area 2425, when measured by a suitable integration, divided by the total area of the green resample area 2410, is the coefficient for the input image data point associated with the implied sample area 2415 in the coefficient matrix $c_{k1}$ for the green color subpixel associated with the green reconstruction point 2406. Another sub-area of the implied input sample area 2415 is the overlap with the green resample area 2410 not overlapping the fourth-color resample area 2430, forming a double intersection set overlap area 2435. This area 2435 divided by the area of the green resample area 2410 is the coefficient for the input image data point associated with the implied sample area 2415 in the coefficient matrix $c_{k2}$ for the green color subpixel associated with the green reconstruction point 2406. This same area divided by the non-fourth-color-overlap area 2430 is the coefficient in the phantom coefficient matrix $c_{kx-w}$ used to calculate the modifier coefficient in the coefficient matrix $c_{k3}$. The rest of the coefficients in the various matrices are derived in like manner.

The complexity of the above algorithms can be avoided using a simplification in which the resample areas of both the red and green are reduced by the amount that is covered by the fourth-color resample area. Several methods of determining the area of the fourth-color resample are given below.

Figure 25:
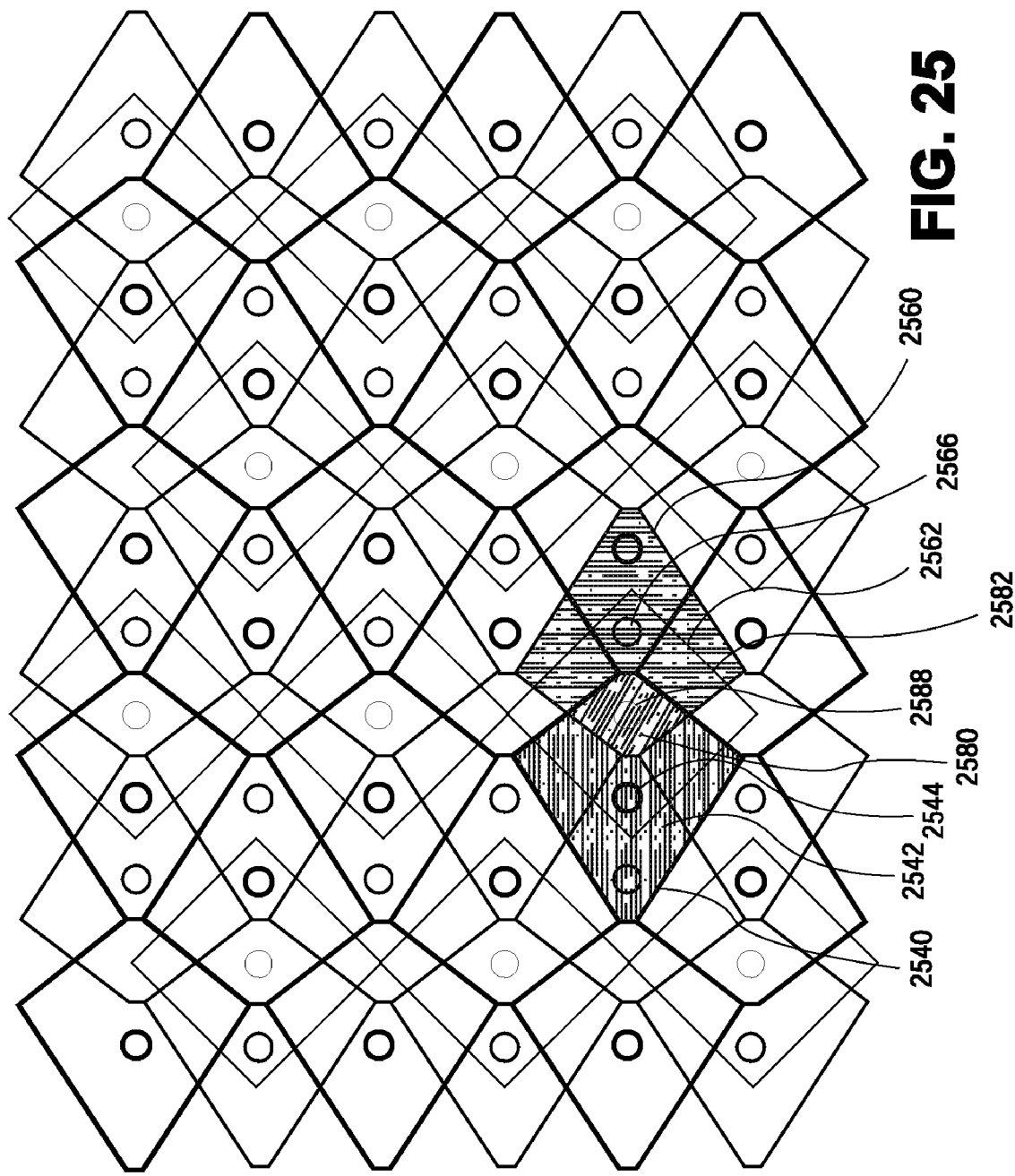
FIG. 25 shows the reconstruction points and another novel set of resample areas for the arrangement of FIG. 22 in which one of the minority color plane resample areas is not shown for clarity.

One straight forward method of determine the area of the fourth-color resample area 2580 associated with the fourth-color reconstruction point 2588 is to define it as the overlap of the red resample area 2540 associated with the red reconstruction point 2544 and the green resample area 2560 associated with the green reconstruction point 2566 as is shown in FIG. 25. The effective red resample area 2542 is thus defined as the resample area 2540 not overlapping the green resample area 2560. The effective green resample area 2562 is similarly defined as the resample area 2560 not overlapping the red resample area 2540. Thus, the fourth-color subpixel has an associated resample area 2580 coverage of the input image data set to itself The algorithm to subpixel render the data simplifies to:

$$W_{out} = \min(\Sigma R_{in} \times c_k, \Sigma G_{in} \times c_k, \Sigma B_{in} \times c_k)$$

$$R_{out} = \Sigma c_{k-w} R_{in}$$

$$G_{out} = \Sigma c_{k-w} G_{in}$$

$$B_{out} = \Sigma c_k B_{in}$$

where $c_{k-w}$ is the coefficient matrix for the effective resample area for the given color reconstruction point, considering it to be the only area covered.

The above resample areas for the fourth-color cover the same, coincident, area in each of the color planes. This coincident area may be defined by some "natural" boundaries as above, or by fiat to some other shape or shapes. The fourth-color resample areas do not have to be coincident for each color plane. An example of which is described below.

Figure 26:
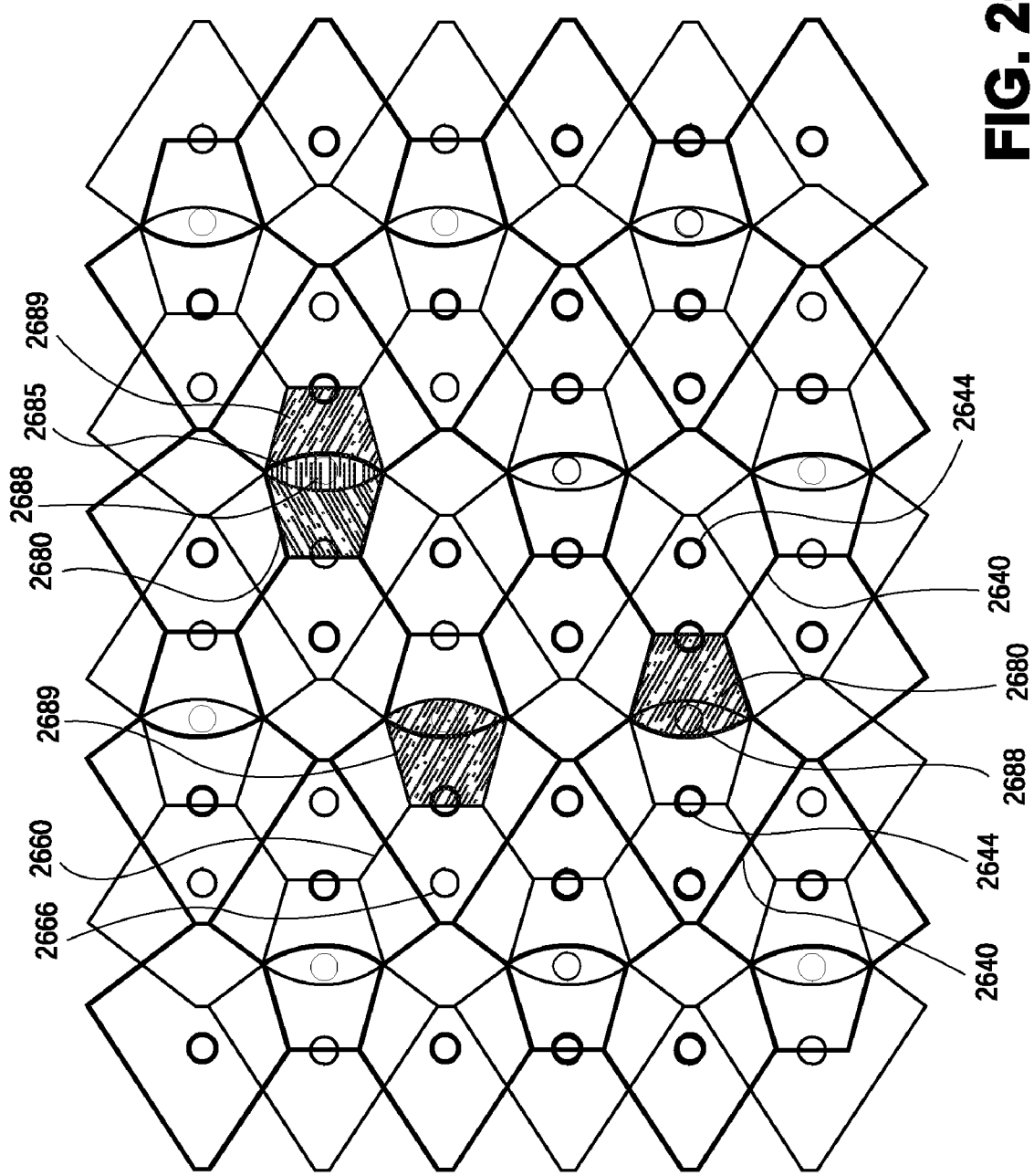
FIG. 26 shows the reconstruction points and yet another novel set of resample areas for the arrangement of FIG. 22 in which one of the minority color plane resample areas is not shown for clarity.

Examining FIG. 26, the red resample areas 2640 associated with the red reconstruction points 2644 and green resample areas 2660 associated with green reconstruction points have been reduced in area to accommodate the fourth-color resample areas 2680 and 2689 associated with fourth color reconstruction points 2688. With this arrangement of resample areas, the fourth-color resample areas 2680 that are resampling the red color plane is not coincident with the fourth-color resample areas 2689 that are resampling the green color plane. There are overlap regions 2685 directly over the fourth-color reconstruction points.

The novel arrangement of resample areas shown in FIG. 26 is generated by a modification to the algorithm that is used to generate the resample areas shown in FIGS. 24A and 24B in which the fourth-color is treated as belonging to the set of reconstruction points for the majority colors. The method of generating the arrangements in FIGS. 24A and 24B is to "seed a crystal" at each reconstruction point within a color plane, then allowing the seed to grow isotropically in diameter until it "touches" another crystal, thus forming the boundaries of the resample areas. This generates boundaries in which a given random point is enclosed along with the nearest reconstruction point, in accordance with the teaching in '355 application. The modification to the resample area generation algorithm that generated FIG. 26 is both to include the fourth-color reconstruction points and to delay the start of the fourth-color "seed crystal" growth. By delaying the start of the "seed crystals" the fourth-color resample areas are reduced in area. The greater the delay, the smaller the fourth-color resample areas.

To help illustrate some of the principles developed herein, the following is a numerical example of calculating filter coefficients. As such, this example is not offered to limit the scope of the present invention in anyway. Indeed other numerical example are possible from other configurations—thus, the following is merely illustrative.

In this example of how to calculate all the coefficient matrices described above, the case is considered where the implied input sample points are coincident with the resample points. This is true when the input image is not being scaled, or when there is one input sample point for each output red or green resample point.

Consider the resample areas 2410 and 2450 of FIG. 24A together with each of the sub-resample areas 2420, 2430, 2455, 2460, 2470 and 2480. The numerical area of each sub-resample area is computed. The area of each sub-resample area that falls into each of the implied input sample areas is summed so that the proportion of these areas to the total area can be calculated. This would result in coefficient tables that are typically 3×3 and contain fractional numbers that sum to one. Of course, other matrices dimensions and scaling could be employed. For ease of use in hardware designs these coefficients are converted to fixed-point binary numbers by multiplying them all by 256. The result for sub-resample area 2430 would be the intermediate coefficient matrix $C_{kx-w}$ mentioned above:

$$C_{kx-w} = \begin{array}{|c|c|c|} \hline 0 & 42 & 0 \\ \hline 102 & 70 & 0 \\ \hline 0 & 42 & 0 \\ \hline \end{array}$$

This $C_{kx-w}$ matrix was calculated with respect to the sub-resample area but the $C_{k2}$ matrix must be calculated with respect to the whole resample area. This can be done by multiplying the $C_{kx-w}$ matrix by the ratio of the sub-resample area over the whole resample area (4010/8712 in the case of sub-resample area 2430 and whole resample area 2410). The result in this case would be:

$$C_{k2} = \begin{array}{|c|c|c|} \hline 0 & 19 & 0 \\ \hline 47 & 32 & 0 \\ \hline 0 & 19 & 0 \\ \hline \end{array}$$

In a similar procedure the sub-resample area 2420 is measured to produce the coefficient matrix $C_{k1}$:

$$C_{k1} = \begin{array}{|c|c|c|} \hline 0 & 9 & 0 \\ \hline 0 & 96 & 25 \\ \hline 0 & 9 & 0 \\ \hline \end{array}$$

Note that neither of these matrices sums to 256 but together they do. Some care must be taken when rounding the numbers to small integers to make sure that this relationship remains true.

From the relationship $c_{k2}+c_{k3}=c_{kx-w}$ given above it is now possible to calculate the modifier coefficient matrix $C_{k3}=C_{kx-w}-C_{k2}$ giving the result below:

$$C_{k3} = \begin{array}{|c|c|c|} \hline 0 & 23 & 0 \\ \hline 55 & 38 & 0 \\ \hline 0 & 23 & 0 \\ \hline \end{array}$$

In resample area 2450 the sub-resample area 2455 lies outside three overlap areas 2460, 2470 and 2480. Note that this area 2455 includes two separate areas that do not necessarily connect but must be taken into account. When the coefficient table for this area is built the result is another intermediate matrix:

$$C_{kx-w} = \begin{array}{|c|c|c|} \hline 0 & 12 & 0 \\ \hline 18 & 180 & 34 \\ \hline 0 & 12 & 0 \\ \hline \end{array}$$

In this case even with multiple overlap areas there is still only one $C_{k2}$ matrix and multiplying the above matrix by 4602/8712 (the ratio of the areas of sub-resample area 2455 over the whole resample area 2450) results in:

$$C_{k2} = \begin{array}{|c|c|c|} \hline 0 & 6 & 0 \\ \hline 10 & 95 & 18 \\ \hline 0 & 6 & 0 \\ \hline \end{array}$$

In the case of resample area 2450 there are three overlapping sub-resample areas 2460, 2470 and 2480. Each of these areas must be treated separately resulting in three coefficient matrices. Each of these is calculated in a manner similar to the way that $C_{k2}$ is calculated above resulting in:

$$C_{k11} = \begin{array}{|c|c|c|} \hline 0 & 0 & 0 \\ \hline 7 & 17 & 0 \\ \hline 0 & 22 & 0 \\ \hline \end{array} \quad C_{k12} = \begin{array}{|c|c|c|} \hline 0 & 22 & 0 \\ \hline 7 & 17 & 0 \\ \hline 0 & 0 & 0 \\ \hline \end{array} \quad C_{k13} = \begin{array}{|c|c|c|} \hline 0 & 0 & 0 \\ \hline 0 & 0 & 41 \\ \hline 0 & 0 & 0 \\ \hline \end{array}$$

where $C_{k11}$, $C_{k12}$ and $C_{k13}$ are the coefficient matrices for sub-resample areas 2460, 2470 and 2480 respectively.

Finally, three modifier matrices must be calculated. $C_{k31}$, $C_{k32}$ and $C_{k33}$ for sub-resample areas 2460, 2470 and 2480 respectively. From the relationship $c_{k2}+c_{k31}+c_{k32}+c_{k33}=c_{kx-w}$ it can be seen that the three modifier matrices must sum to $C_{kx-w}-C_{k2}$ which equals the matrix $$\begin{array}{|c|c|c|} \hline 0 & 6 & 0 \\ \hline 8 & 85 & 16 \\ \hline 0 & 6 & 0 \\ \hline \end{array}$$

Each of the three modifiers is apportioned a fraction of this matrix according to the relative size of its area. In this example, the areas of sub-resample areas 2460, 2470 and 2480 are 1557, 1557 and 1392 respectively resulting in a total of 4506. So to calculate $C_{k31}$, multiply the above matrix by 1557/4506. The result is identical for $C_{k32}$. To calculate $C_{k33}$ we multiply the above matrix by 1392/4506. Thus the three modifier matrices are:

$$C_{k31} = \begin{array}{|c|c|c|} \hline 0 & 2 & 0 \\ \hline 3 & 29 & 6 \\ \hline 0 & 2 & 0 \\ \hline \end{array} \quad C_{k32} = \begin{array}{|c|c|c|} \hline 0 & 2 & 0 \\ \hline 3 & 29 & 6 \\ \hline 0 & 2 & 0 \\ \hline \end{array} \quad C_{k33} = \begin{array}{|c|c|c|} \hline 0 & 2 & 0 \\ \hline 3 & 26 & 5 \\ \hline 0 & 2 & 0 \\ \hline \end{array}$$

Examining FIG. 24A it is possible to see that all the other sub-resample areas are either identical to the ones described above, or are mirror images of the ones described. The coefficient matrices calculated in the above example can simply be flipped left-to-right to create a set of matrices for the mirrored resample areas. No more calculations are necessary to produce all the coefficients necessary for this example.

All the above calculations were done with the assumption that the implied input sample points were coincident with the resample points. This is true when the input image is not being scaled, when there is one input sample point for each output red or green resample point. When the input image is being scaled the calculations are made more complex by the introduction of a "repeat cell" of coefficients. A different set of coefficients must be calculated for each cell of the repeat cell.

The above use of transmissive liquid crystal displays as example embodiments is not to be construed as restricting the scope of this invention. It will be obvious to those skilled in the art, that adjusting the luminance and chrominance and positions of the emitters of non-transmissive display panels, such as reflective Liquid Crystal Displays, emissive Electro Luminescent Displays (EL), Plasma Display Panels (PDP), Field Emitter Displays (FED), Electrophoretic displays, Iridescent Displays (ID), Incandescent Displays, solid state Light Emitting Diode (LED) display, and Organic Light Emitting Diode (OLED) displays, will also be improved using this teaching and are to be considered within the scope of the present invention. Variations on the resample area definitions, coefficient matrices, and algorithms may suggest themselves to those knowledgeable in the art and should be considered to be within the scope of the present invention.

The foregoing description has not been limited to a specific embodiment of this invention. It will be apparent, however, that various variations and modifications may be made to the invention, with the attainment of some or all of the advantages of the invention. It is the object of the appended claims to cover these and such other variations and modifications as come within the true spirit and scope of the invention.

Other embodiments of the invention will be apparent from consideration of the specification and practice of the invention disclosed herein. It is intended that the specification and examples be considered as exemplary only, with a true scope and spirit of the invention being indicated by the following claims.

What is claimed is:

1. A display comprising:
   a repeating arrangement of at least three color sub-pixels, said at least three colors comprising a red and a green sub-pixel, said red and green sub-pixels comprising a red and a green filter respectively and further wherein said red and green sub-pixels comprise substantially the same luminance when the same energy level is applied to said red and green sub-pixels; and
   a sub-pixel rendering means capable of shifting an apparent center of luminance of an input image pixel datum, said input image pixel datum further comprising a plurality of input image sub-pixel data, and wherein each said red and green sub-pixel is capable of substantially displaying the luminance value of said input image pixel datum, wherein said repeating arrangement comprises two rows of at least three sub-pixels, and wherein said red and green sub-pixels are disposed in said two rows according to the pattern

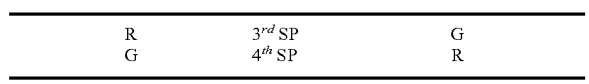

| R | $3^{rd}$ SP | G |
| G | $4^{th}$ SP | R | where $3^{rd}$ SP designates a third color sub-pixel and $4^{th}$ Sp designates a fourth color sub-pixel.

2. The display of claim 1, wherein said red sub-pixel filter comprises a more transmissive filter than said green sub-pixel filter.

3. The display of claim 2, wherein said red sub-pixel filter comprises one of a group, said group comprising:
   a red filter comprising a physically thinner filter than said green filter;
   a red filter comprising a red pigment comprising a reduced amount of pigment as compared to said green filter;
   a red filter comprising a pigment comprising greater transmissivity of light than said green filter; and
   a red filter comprising a broad transmissivity range of frequencies on either side of the red center point.

4. The display of claim 2, wherein said green sub-pixel filter comprises one of a group, said group comprising:
   a green filter comprising a physically thicker filter than said red filter;
   a green filter comprising a green pigment comprising a increased amount of pigment as compared to said red filter;
   a green filter comprising a pigment comprising lesser transmissivity of light than said red filter; and a green filter comprising a narrow transmissivity range of frequencies on either side of the green center point.

5. The display of claim 1, wherein the backlight comprises more frequencies in the red range.

6. The display of claim 1, wherein said green sub-pixel comprises a green filter such that the pass band of said green filter is narrowed and such that the chromaticity of said green filter broadens the color gamut into a deeper green color.

7. The display of claim 6, wherein said repeating arrangement comprises two rows of at least two sub-pixels, and
   each row comprises one of said green sub-pixels disposed according to the pattern

| G | $1^{st}$ SP |
|---|---|
| $3^{rd}$ SP | G | where $1^{st}$ SP designates a first color sub-pixel and $3^{rd}$ SP designates a third color sub-pixel.

8. The display of claim 6, wherein said repeating arrangement further comprises a fourth color sub-pixel;
   said fourth color comprising a substantial amount of green color.

9. The display of claim 8, wherein said fourth color comprises one of a group, said group comprising: cyan, magenta, greenish-blue, and greenish-grey.

10. The display of claim 8, wherein said repeating arrangement comprises at least six sub-pixels.

11. The display of claim 10, wherein said red and green sub-pixels are disposed in a checkerboard pattern in said repeating arrangement.

12. The display of claim 8, wherein said repeating arrangement comprises two rows of at least two sub-pixels, and
   said sub-pixels are disposed according to the pattern

| G | $1^{st}$ SP |
|---|---|
| $3^{rd}$ SP | $4^{th}$ SP | wherein $1^{st}$ SP designates a first color sub-pixel, $3^{rd}$ SP designates a third color sub-pixel and $4^{th}$ Sp designates said fourth color sub-pixel comprising said substantial amount of green color.

13. The display of claim 1, wherein said repeating arrangement further comprises a fourth color;
   said fourth color comprising one of a group of colors, said group comprising grey, blue-grey, and filtered white.

14. The display of claim 13, wherein the backlight comprises more energy in the blue spectrum than red or green spectrum.

15. The display of claim 1, wherein one of said third color sub-pixel and said fourth color sub-pixel is a blue color sub-pixel.

16. The display of claim 1, wherein one of said third color sub-pixel and said fourth color sub-pixel is one of a group of colors, said group comprising yellow, cyan, light gray, magenta and white.

17. A display comprising:
   a repeating arrangement of at least four sub-pixels, said repeating arrangement comprising a red sub-pixel, a green sub-pixel, a cyan sub-pixel and a magenta sub-pixel such that when said red sub-pixel and said cyan sub-pixel are substantially fully on and when said green and said magenta sub-pixels are off, said repeating arrangement displays a substantially white color; and
   a sub-pixel rendering means capable of shifting an apparent center of luminance of an input image pixel datum, said input image pixel datum further comprising a plurality of input image sub-pixel data, and wherein each said red, green, cyan and magenta sub-pixel is capable of substantially displaying the luminance value of said input image pixel datum, wherein each of said red, green, cyan and magenta sub-pixels of said repeating arrangement comprise substantially the same luminance when the same energy level is applied to said sub-pixels; and
   wherein said red, green, cyan and magenta sub-pixels of said repeating arrangement are disposed in two rows of three sub-pixels according to one of the patterns

| R | G | CY |
|---|---|---|
| CY | M | R | and

| R | M | CY |
|---|---|---|
| CY | G | R | and

| G | R | M |
|---|---|---|
| M | CY | G | and

| G | CY | M |
|---|---|---|
| M | R | G. |

18. The display of claim 17, wherein said red, green, cyan and magenta sub-pixels of said repeating arrangement are disposed in two rows of two sub-pixels.

19. A display comprising:
   a repeating arrangement of at least four sub-pixels, said repeating arrangement comprising a red sub-pixel, a green sub-pixel, a cyan sub-pixel and a magenta sub-pixel such that when said green and said magenta sub-pixels are substantially fully on and when said red sub-pixel and said cyan sub-pixel are off, said repeating arrangement displays a substantially white color; and
   a sub-pixel rendering means capable of shifting an apparent center of luminance of an input image pixel datum, said input image pixel datum further comprising a plurality of input image sub-pixel data, and wherein each said red, green, cyan and magenta sub-pixel is capable of substantially displaying a luminance value of said input image pixel datum, wherein said luminance values for each of said fourth color sub-pixels are a function of luminance values computed using said input image data for at least two of said red, green and blue sub-pixels.

20. A display comprising:
   a repeating arrangement of at least six sub-pixels comprising four colors, said arrangement comprising two red sub-pixels, two green sub-pixels, a blue sub-pixel and a forth color sub-pixel arranged in first and second rows, said first row comprising a red sub-pixel, a green sub-pixel and said blue sub-pixel, said second row comprising a red sub-pixel, a green sub-pixel and said fourth color sub-pixel;

input receiving means for receiving input image data comprising red, green and blue data and indicating an image; and a sub-pixel rendering means for producing luminance values for each of said fourth color sub-pixels in said repeating arrangement using said input image data, wherein said luminance values for each of said fourth color sub-pixels are a function of luminance values computed using said input image data for at least two of said red, green and blue sub-pixels.

21. The display of claim 20, wherein said sub-pixel rendering means produces said luminance values for each of said fourth color sub-pixels using resample areas determined for at least two of said red, green and blue sub-pixels; each resample area indicating a subset of said input image data to be used for producing said luminance values for each of said fourth color sub-pixels.

22. The display of claim 20, wherein said sub-pixel rendering means produces said luminance values for each of said fourth color sub-pixels using a set of reconstruction points for each of said red, green and blue sub-pixels; each reconstruction point being positioned at the center of a resample area indicating a subset of said input image data to be used for producing said luminance values for each of said fourth color sub-pixels.

23. The display of claim 22, wherein said sub-pixel rendering means, for each set of reconstruction points for each of said red, green and blue sub-pixels, computes a set of coefficients using said subset of said input image data.

24. The display of claim 20, wherein said repeating arrangement further comprises a second horizontally adjacent repeating arrangement of at least six sub-pixels comprising two rows;

said first row of said second horizontally adjacent repeating arrangement comprising a red sub-pixel, a green sub-pixel and a fourth color sub-pixel, and said second row of said second horizontally adjacent repeating arrangement comprising a red sub-pixel, a green sub-pixel and a blue sub-pixel.

* * * * *